(12) United States Patent
Takeshima et al.

(10) Patent No.: US 10,796,900 B2
(45) Date of Patent: Oct. 6, 2020

(54) METHOD OF MANUFACTURING SEMICONDUCTOR DEVICE

(71) Applicant: KOKUSAI ELECTRIC CORPORATION, Tokyo (JP)

(72) Inventors: Yuichiro Takeshima, Toyama (JP); Masanori Nakayama, Toyama (JP); Katsunori Funaki, Toyama (JP); Yasutoshi Tsubota, Toyama (JP); Hiroto Igawa, Toyama (JP)

(73) Assignee: Kokusai Electric Corporation, Tokyo (JP)

( * ) Notice: Subject to any disclaimer, the term of this patent is extended or adjusted under 35 U.S.C. 154(b) by 0 days.

(21) Appl. No.: 16/528,048

(22) Filed: Jul. 31, 2019

(65) Prior Publication Data
US 2019/0355575 A1 Nov. 21, 2019

Related U.S. Application Data

(63) Continuation of application No. PCT/JP2017/012314, filed on Mar. 27, 2017.

(51) Int. Cl.
| | |
|---|---|
| *H01L 21/00* | (2006.01) |
| *H01L 21/02* | (2006.01) |
| *C23C 16/40* | (2006.01) |
| *C23C 16/50* | (2006.01) |
| *H01L 27/11582* | (2017.01) |

(52) U.S. Cl.
CPC ...... *H01L 21/02164* (2013.01); *C23C 16/401* (2013.01); *C23C 16/50* (2013.01); *H01L 21/02274* (2013.01); *H01L 27/11582* (2013.01)

(58) Field of Classification Search
None
See application file for complete search history.

(56) References Cited

U.S. PATENT DOCUMENTS

| | | |
|---|---|---|
| 2010/0029093 A1 | 2/2010 | Shiozawa et al. |
| 2010/0136797 A1 | 6/2010 | Kabe et al. |
| 2010/0216317 A1 | 8/2010 | Tjandra et al. |
| 2011/0017586 A1 | 1/2011 | Nakamura et al. |

(Continued)

FOREIGN PATENT DOCUMENTS

| | | |
|---|---|---|
| JP | 2002-280369 A | 9/2002 |
| JP | 2008-251855 A | 10/2008 |

(Continued)

*Primary Examiner* — Reema Patel
(74) *Attorney, Agent, or Firm* — Volpe and Koenig, P.C.

(57) ABSTRACT

Described herein is a technique capable of improving electrical characteristics of a semiconductor device. According to the technique, there is provided a method of manufacturing a semiconductor device including: (a) generating oxygen and hydrogen active species; and (b) forming an oxide layer by supplying the oxygen and hydrogen active species to a substrate with a concave structure to subject a film on an inner surface of the concave structure to oxidation, wherein the oxide layer is formed in (b) such that a thickness of the oxide layer is greater on the inner surface than at an upper end portion of the concave structure by setting a ratio of a flow rate of the hydrogen active species to a total flow rate to a predetermined ratio greater than a first ratio at which a rate of forming the oxide layer is maximized at the upper end portion of the concave structure.

15 Claims, 14 Drawing Sheets

(56) References Cited

U.S. PATENT DOCUMENTS

| | | |
|---|---|---|
| 2012/0252226 A1 | 10/2012 | Kabe et al. |
| 2013/0164942 A1* | 6/2013 | Kato ................ C23C 16/45536 438/758 |
| 2014/0106573 A1 | 4/2014 | Terasaki et al. |

FOREIGN PATENT DOCUMENTS

| | | |
|---|---|---|
| JP | 2009-200483 A | 9/2009 |
| JP | 2012-516577 A | 7/2012 |
| JP | 2012-216667 A | 11/2012 |
| JP | 2014-075579 A | 4/2014 |
| WO | 2008/041601 A1 | 4/2008 |

\* cited by examiner

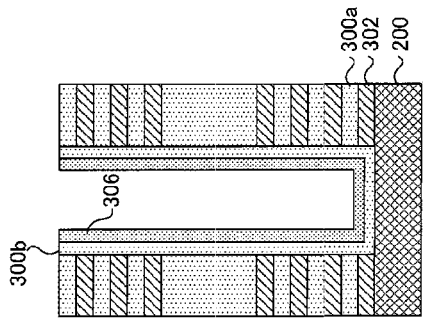
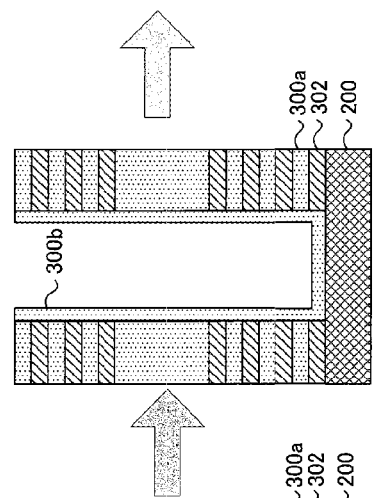
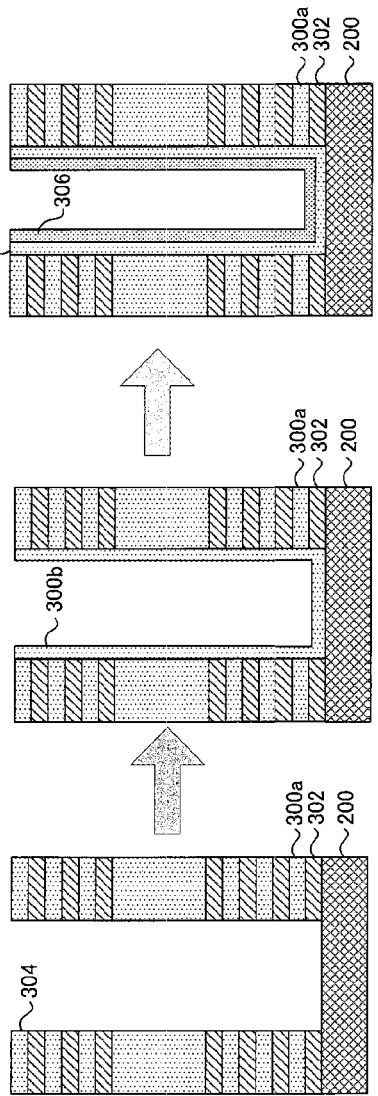
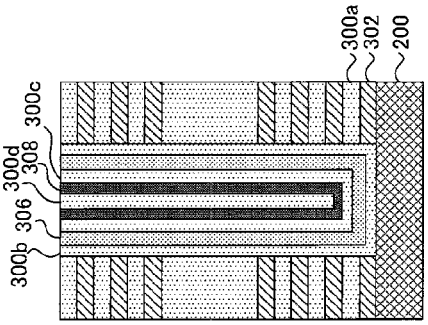
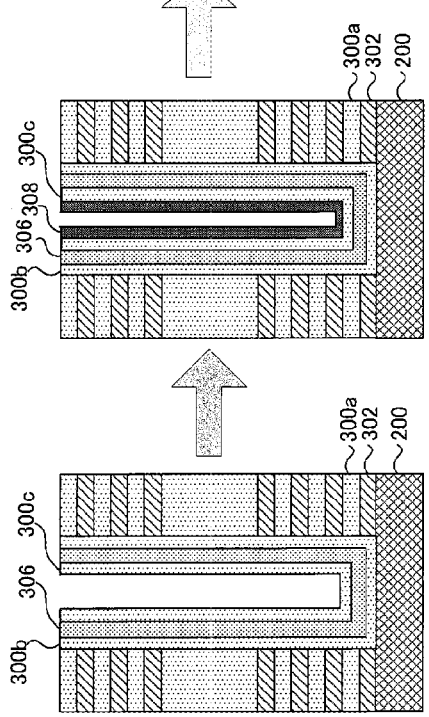

FIG. 11
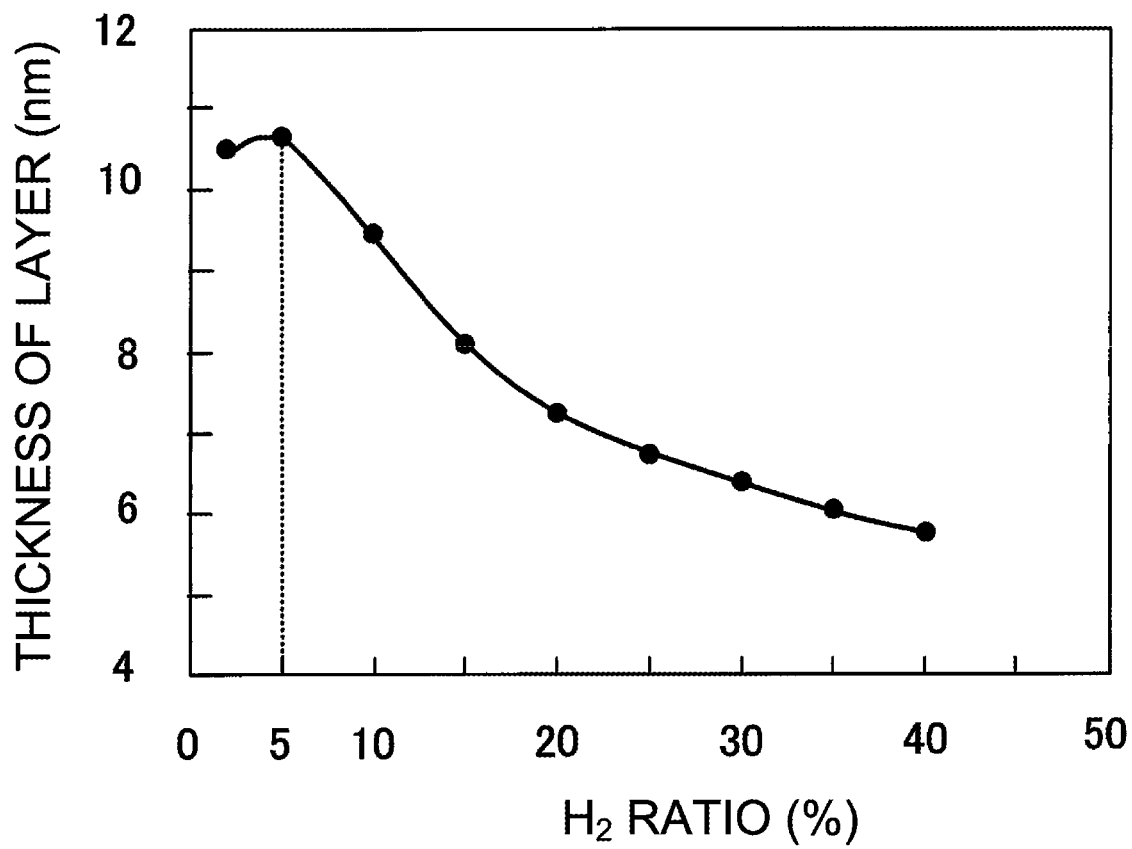
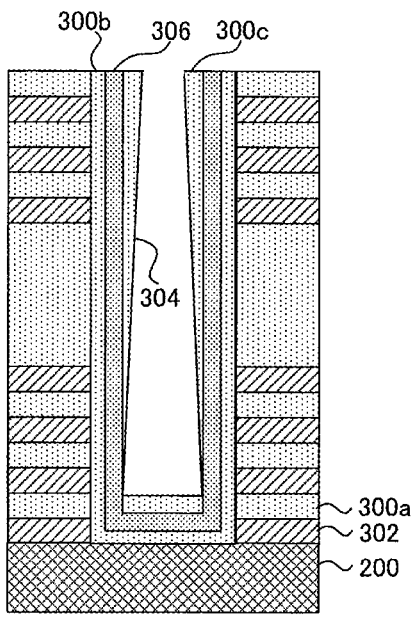
FIG. 12A
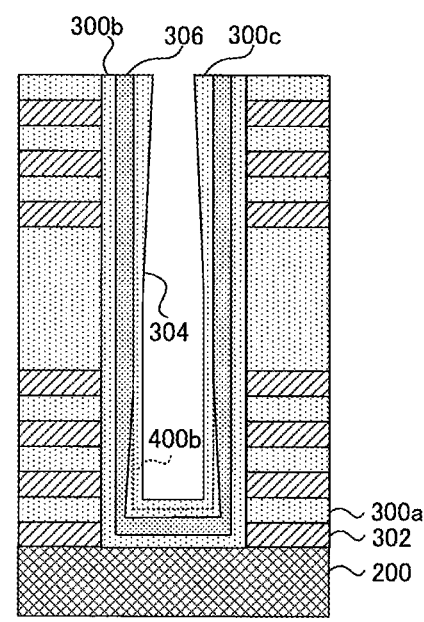
FIG. 12B

US 10,796,900 B2

METHOD OF MANUFACTURING SEMICONDUCTOR DEVICE

CROSS-REFERENCE TO RELATED PATENT APPLICATION

This non-provisional U.S. patent application claims priority under 35 U.S.C. § 119 of International Application No. PCT/JP2017/012314, filed on Mar. 27, 2017, in the WIPO, the entire contents of which are hereby incorporated by reference.

BACKGROUND

1. Field

The present disclosure relates to a method of manufacturing a semiconductor device.

2. Description of the Related Art

Recently, in order to form patterns of a semiconductor device such as a flash memory, a predetermined process such as an oxidation process and a nitridation process on a substrate, which is one of manufacturing processes of the semiconductor device, may be performed.

According to related arts, there is provided a configuration including: a substrate process chamber with a substrate processing space in communication with a plasma generation space; an inductive coupling structure provided outside the plasma generation space; a substrate support provided in the substrate processing space and on which a substrate with a groove formed thereon is placed; and a gas supply system including an oxygen gas supply system configured to supply an oxygen-containing gas to the plasma generation space. A silicon-containing layer is formed on a surface of the groove.

In the manufacturing processes of the semiconductor device, when a film formed on an inner surface of a concave structure such as a trench structure and a hole structure with a high aspect ratio is modified from a surface of the film to form a modified layer, it may be required to adjust a thickness of the modified layer in a depth direction of the concave structure such that the thickness of the modified layer has a desired distribution.

SUMMARY

Described herein is a technique capable of improving electrical characteristics of a semiconductor device by adjusting a thickness of a modified layer in a depth direction of a concave structure such that the thickness of the modified layer has a desired distribution when a film formed on an inner surface of a concave structure with a high aspect ratio is modified from a surface of the film to form the modified layer.

According to one aspect of the technique of the present disclosure, there is provided a method of manufacturing a semiconductor device including: (a) generating an oxygen active species and a hydrogen active species by exciting a process gas containing an oxygen-containing gas and a hydrogen-containing gas; and (b) forming an oxide layer by supplying the oxygen active species and the hydrogen active species to a substrate with a concave structure formed thereon to subject a film formed on an inner surface of the concave structure to oxidation from a surface of the film, wherein the oxide layer is formed in (b) such that a thickness of the oxide layer on the inner surface of the concave structure is greater than that of the oxide layer at an upper end portion of the concave structure by setting a ratio of a flow rate of the hydrogen active species to a total flow rate of the oxygen active species and the hydrogen active species supplied to the substrate to a predetermined ratio greater than a first ratio at which a rate of forming the oxide layer is maximized at the upper end portion of the concave structure.

BRIEF DESCRIPTION OF THE DRAWINGS

FIGS. 6A through 6F schematically illustrate exemplary cross-sectional views of the substrate according to substrate processing procedures according to the substrate processing of the embodiments described herein.

FIG. 11 schematically illustrates a relationship between a $H_2$ ratio and a thickness of an oxide layer formed on an upper surface of a planar wafer, the $H_2$ ratio indicating a ratio of a flow rate of a $H_2$ gas to a total flow rate of the $H_2$ gas and an $O_2$ gas supplied into a process chamber.

FIG. 12A schematically illustrates another exemplary cross-sectional view of the concave structure of the substrate before performing the substrate processing of the embodiments.

FIG. 12B schematically illustrates another exemplary cross-sectional view of the concave structure of the substrate after performing the substrate processing of the embodiments.

DETAILED DESCRIPTION

Embodiments

Hereinafter, one or more embodiments (hereinafter, simply referred to as "embodiments") according to the technique of the present disclosure will be described. First, a first embodiment according to the technique of the present disclosure will be described.

(1) Configuration of Substrate Processing Apparatus

Figure 1:
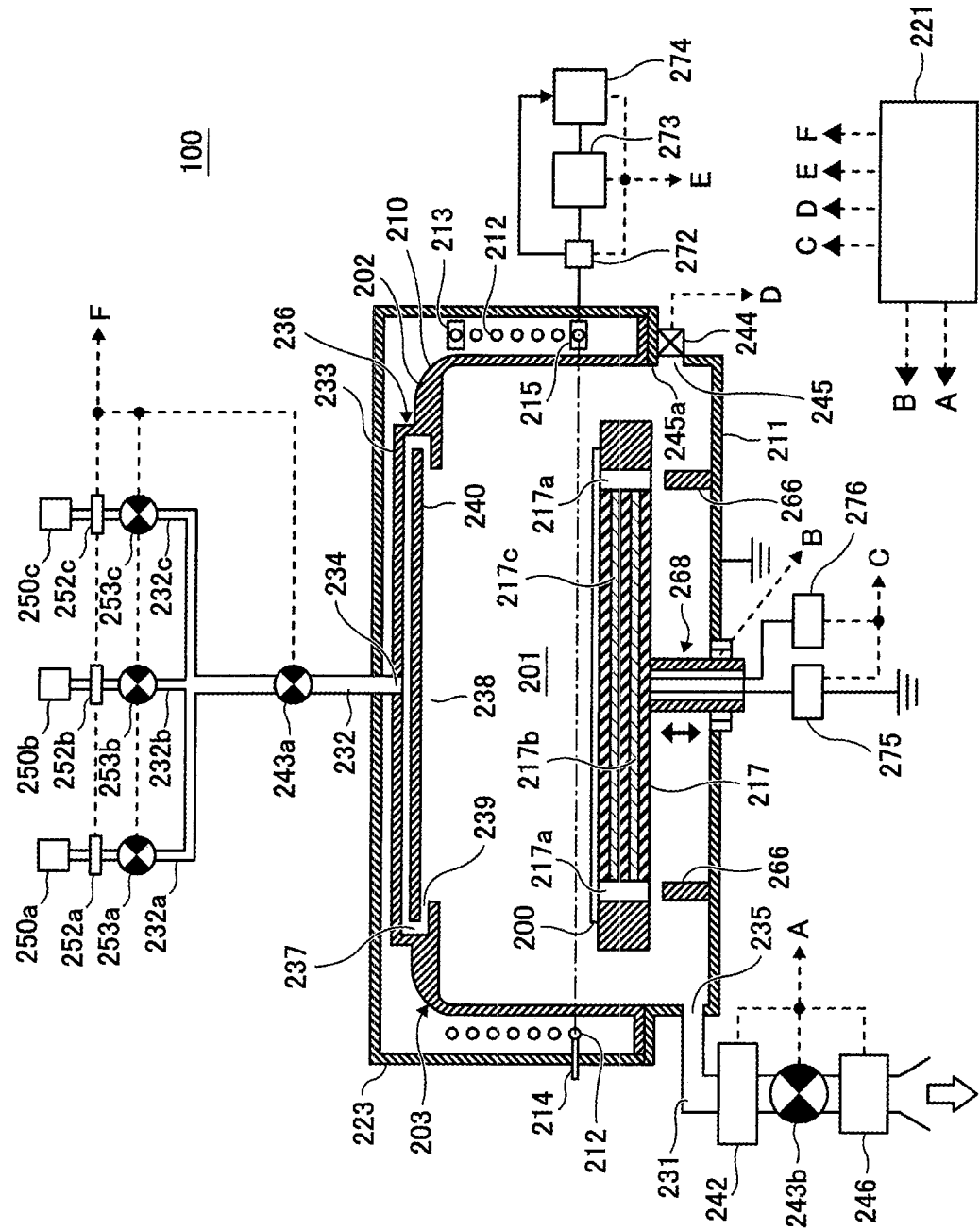
FIG. 1 schematically illustrates a vertical cross-section of a substrate processing apparatus according to one or more embodiments described herein.
Figure 2:
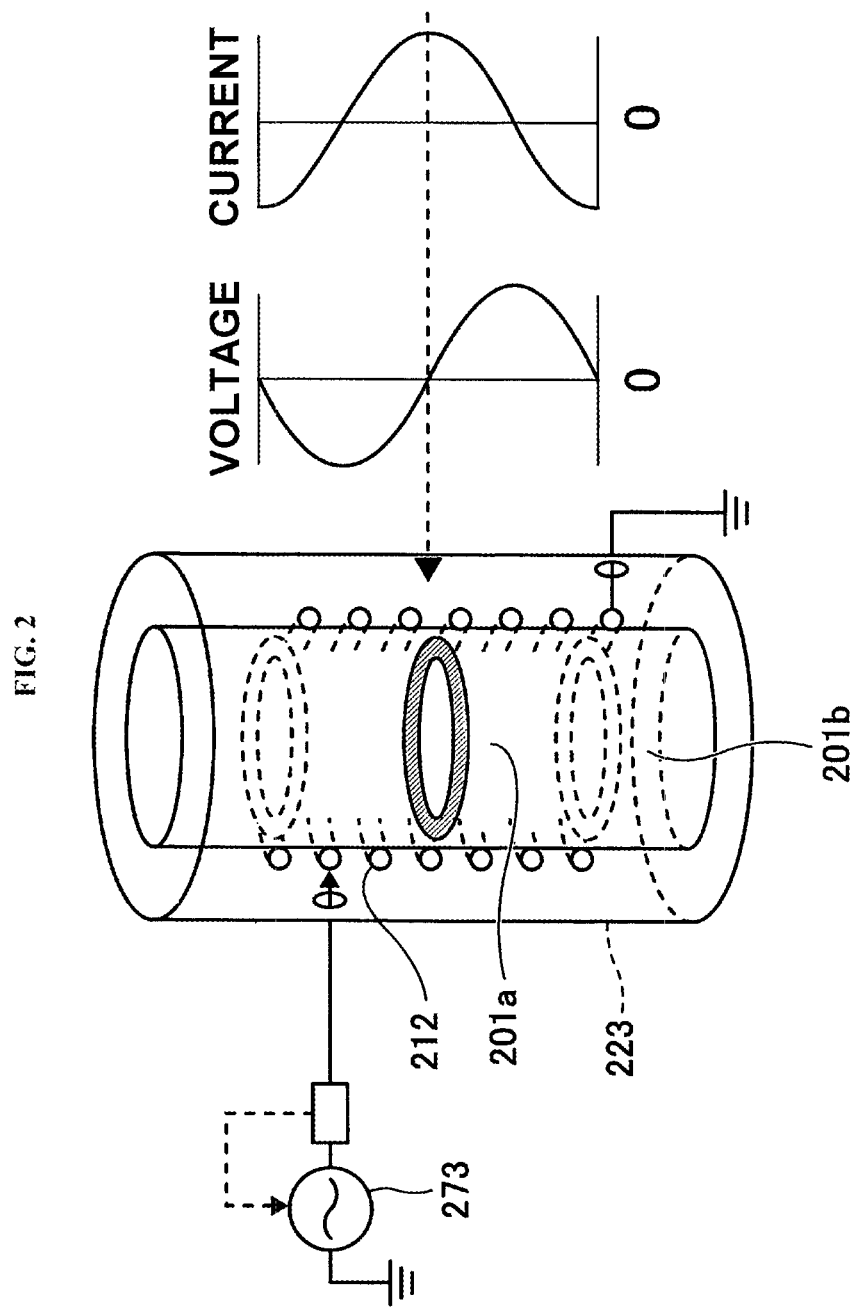
FIG. 2 schematically illustrates a principle of generating plasma in the substrate processing apparatus according to the embodiments.

Hereinafter, a substrate processing apparatus according to the embodiments will be described with reference to FIGS. 1 through 3.

<Process Chamber>

A substrate processing apparatus 100 includes a process furnace 202 where a wafer 200 is processed by plasma. The process furnace 202 includes a process vessel 203. A process chamber 201 is defined by the process vessel 203. The process vessel 203 includes a dome-shaped upper vessel 210 serving as a first vessel and a bowl-shaped lower vessel 211 serving as a second vessel. By covering the lower vessel 211 with the upper vessel 210, the process chamber 201 is defined.

A gate valve 244 is provided on a lower side wall of the lower vessel 211. While the gate valve 244 is open, the wafer 200 can be transferred (loaded) into the process chamber 201 through a substrate loading/unloading port 245 or be transferred (unloaded) out of the process chamber 201 through the substrate loading/unloading port 245. While the gate valve 244 is closed, the gate valve 244 maintains the process chamber 201 airtight.

The process chamber 201 includes a plasma generation space 201a that a coil (also referred to as a "resonance coil") 212 described later is provided therearound and a substrate processing space 201b where the wafer 200 is processed. The substrate processing space 201b communicates with the plasma generation space 201a. The plasma generation space 201a refers to a space where the plasma is generated, for example, a space above a lower end of the coil 212 (indicated by a dashed line in FIG. 1) in the process chamber 201. The substrate processing space 201b refers to a space where the wafer 200 is processed by the plasma, for example, a space below the lower end of the coil 212.

<Susceptor>

A susceptor 217 serving as a part of a substrate support is provided at a center of a bottom portion of the process chamber 201. The wafer 200 can be placed on the susceptor 217.

A heater 217b serving as a heating mechanism is integrally embedded in the susceptor 217. When electric power is supplied through a heater power adjustment mechanism 276, the heater 217b is configured to heat the wafer 200 such that a surface temperature of the wafer 200 may range, for example, from about 25° C. to about 1,000° C.

The susceptor 217 is electrically insulated from the lower vessel 211. An impedance adjustment electrode 217c is provided in the susceptor 217. The impedance adjustment electrode 217c is grounded via an impedance variable mechanism 275 serving as an impedance adjustment mechanism. The impedance variable mechanism 275 is constituted by components such as a coil (not shown) and a variable capacitor (not shown). The impedance variable mechanism 275 is configured to change an impedance thereof from about 0Ω to a parasitic impedance value of the process chamber 201 by controlling the inductance and resistance of the coil (not shown) and the capacitance value of the variable capacitor (not shown). Therefore, it is possible to control the potential (bias voltage) of the wafer 200 via the impedance adjustment electrode 217c and the susceptor 217.

A susceptor elevating mechanism 268 configured to elevate and lower the susceptor 217 is provided at the susceptor 217. Through-holes 217a are provided at the susceptor 217. Wafer lift pins 266 are provided at a bottom of the lower vessel 211 corresponding to the through-holes 217a. At least three of the through-holes 217a and at least three of the wafer lift pins 266 are provided at positions facing each other. When the susceptor 217 is lowered by the susceptor elevating mechanism 268, the wafer lift pins 266 pass through the through-holes 217a.

The substrate support according to the present embodiment is mainly constituted by the susceptor 217, the heater 217b, and the impedance adjustment electrode 217c.

<Gas Supply System>

A gas supply head 236 is provided above the process chamber 201, that is, on an upper portion of the upper vessel 210. The gas supply head 236 includes a cap-shaped lid 233, a gas inlet port 234, a buffer chamber 237, an opening portion 238, a shield plate 240 and a gas outlet port 239. The gas supply head 236 is configured to supply a reactive gas (process gas) into the process chamber 201. The buffer chamber 237 functions as a dispersion space configured to disperse the reactive gas introduced (supplied) through the gas inlet port 234.

A downstream end of a gas supply pipe 232a configured to supply a hydrogen ($H_2$) gas serving as a hydrogen-containing gas, a downstream end of a gas supply pipe 232b configured to supply an oxygen ($O_2$) gas serving as an oxygen-containing gas, a downstream end of a gas supply pipe 232c configured to supply a nitrogen ($N_2$) gas serving as an inert gas or serving as an nitrogen-containing gas is connected to join the gas inlet port 234. A hydrogen gas supply source 250a, a mass flow controller (MFC) 252a serving as a flow rate controller (flow rate control mechanism) and a valve 253a serving as an opening/closing valve are provided in order from an upstream side to a downstream side of the gas supply pipe 232a. An oxygen gas supply source 250b, an MFC 252b and a valve 253b are provided in order from an upstream side to a downstream side of the gas supply pipe 232b. A nitrogen gas supply source 250c, an MFC 252c and a valve 253c are provided in order from an upstream side to a downstream side of the gas supply pipe 232c. A valve 243a is provided on a downstream side where the gas supply pipe 232a, the gas supply pipe 232b and the gas supply pipe 232c join. The valve 243a is connected to an upstream end of the gas inlet port 234. It is possible to supply process gases such as the hydrogen-containing gas, the oxygen-containing gas and the nitrogen-containing gas into the process chamber 201 via the gas supply pipes 232a, 232b and 232c by opening and closing the valves 253a, 253b, 253c and 243a while adjusting the flow rates of the respective gases by the MFCs 252a, 252b and 252c.

A hydrogen-containing gas supply system according to the present embodiment is constituted by the gas supply head 236 (that is, the lid 233, the gas inlet port 234, the buffer chamber 237, the opening portion 238, the shield plate 240 and the gas outlet port 239), the gas supply pipe 232a, the MFC 252a and the valves 253a and 243a.

An oxygen-containing gas supply system according to the present embodiment is constituted by the gas supply head 236, the gas supply pipe 232b, the MFC 252b and the valves 253b and 243a.

A nitrogen-containing gas supply system according to the present embodiment is constituted by the gas supply head 236, the gas supply pipe 232c, the MFC 252c and the valves 253c and 243a.

A gas supply system according to the present embodiment is constituted by the hydrogen-containing gas supply system, the oxygen-containing gas supply system and the nitrogen-containing gas supply system.

<Exhaust System>

A gas exhaust port 235 is provided on a side wall of the lower vessel 211. The gas such as the reactive gas is exhausted from the process chamber 201 through the gas exhaust port 235. An upstream end of a gas exhaust pipe 231 is connected to the gas exhaust port 235. An APC (Automatic Pressure Controller) valve 242 serving as a pressure controller (pressure adjusting mechanism), a valve 243b and a vacuum pump 246 serving as a vacuum exhaust device are provided in order from an upstream side to a downstream side of the gas exhaust pipe 231.

An exhaust system according to the present embodiment is mainly constituted by the gas exhaust port 235, the gas exhaust pipe 231, the APC valve 242 and the valve 243b. The exhaust system may further include the vacuum pump 246.

<Plasma Generator>

A helical resonance coil 212 is provided so as to surround the process chamber 201 around an outer peripheral portion of the process chamber 201, that is, around an outer portion of a side wall of the upper vessel 210. An RF sensor 272, a high frequency power supply 273 and a frequency matching mechanism 274 are connected to the resonance coil 212.

The high frequency power supply 273 supplies a high frequency power to the resonance coil 212. The RF sensor 272 is provided at an output side of the high frequency power supply 273. The RF sensor 272 monitors information of the traveling wave or reflected wave of the supplied high frequency power. The frequency matching mechanism 274 serving as a frequency controller performs a frequency matching operation by controlling the high frequency power supply 273 so as to minimize the reflected wave based on the information of the reflected wave monitored by the RF sensor 272.

Both ends of the resonance coil 212 are electrically grounded. However, at least one end of the resonance coil 212 may be grounded via a movable tap 213 in order to fine-tune an electrical length of the resonance coil 212 when the substrate processing apparatus 100 is initially installed or the processing conditions of the substrate processing apparatus 100 are changed in order for the resonance characteristics of the resonance coil 212 to become approximately same as those of the high frequency power supply 273. A reference numeral 214 in FIG. 1 indicates a fixed ground of the other end of the resonance coil 212. In addition, in order to fine-tune the impedance of the resonance coil 212 when the substrate processing apparatus 100 is initially installed or the processing conditions of the substrate processing apparatus 100 are changed, a power feeding part (not shown) is constituted by the movable tap 215 between the grounded ends of the resonance coil 212.

A shield plate 223 is provided to shield the leakage of the electromagnetic wave to the outside of the resonance coil 212 and to form a capacitive component of the resonance coil 212 necessary for constructing a resonance circuit.

The plasma generator according to the present embodiment is mainly constituted by the resonance coil 212, the RF sensor 272 and the frequency matching mechanism 274. The plasma generator may further include the high frequency power supply 273.

Hereinafter, the principle of plasma generation in the substrate processing apparatus 100 according to the present embodiment and the properties of the generated plasma will be described with reference to FIG. 2.

A winding diameter, a winding pitch and the number of winding turns of the resonance coil 212 are set such that the resonance coil 212 resonates in a full-wavelength mode to form a standing wave of a predetermined wavelength. That is, the electrical length of the resonance coil 212 is set to an integral multiple of a wavelength of a predetermined frequency of the high frequency power supplied from the high frequency power supply 273.

Specifically, considering the conditions such as the power to be applied, a strength of a magnetic field to be generated and shapes of the substrate processing apparatus to be applied, the resonance coil 212 having an effective cross-section of 50 $mm^2$ to 300 $mm^2$ and a diameter of 200 mm to 500 mm is wound, for example, twice to 60 times around an outer circumferential side of the process chamber 201 defining the plasma generation space 201a such that the magnetic field of about 0.01 Gauss to about 10 Gauss can be generated by the high frequency power having a frequency of 800 kHz to 50 MHz and a power of 0.5 KW to 5 KW, more preferably 1.0 KW to 4.0 KW.

The high frequency power supply 273 includes a power supply controller (not shown) and an amplifier (not shown). The power supply controller includes a high frequency oscillation circuit (not shown) and a preamplifier (not shown) in order to adjust an oscillation frequency and an output. The amplifier amplifies the output to a predetermined output level. The power supply controller controls the amplifier based on output conditions relating to the frequency and the power, which are set in advance through an operation panel (not shown), and the amplifier supplies a constant high frequency power to the resonance coil 212 via a transmission line.

In the present embodiment, the frequency matching mechanism 274 detects the power of the reflected wave from the resonance coil 212 when the plasma is generated, and increases or decreases the oscillation frequency with respect to the predetermined frequency such that the power of the reflected wave is minimized. Specifically, the frequency matching mechanism 274 includes a frequency control circuit (not shown) configured to adjust a preset oscillation frequency. The RF sensor 272 is provided on an output side of the amplifier of the high frequency power supply 273 in order to detect the power of the reflected wave via the transmission line and to feed back the voltage signal thereof to the frequency control circuit.

The frequency control circuit oscillates at an unloaded resonance frequency of the resonance coil 212 before the plasma is turned on, and oscillates the frequency increased or decreased from the preset frequency after the plasma is turned on so that the power of the reflected wave is minimized. As a result, the frequency control circuit supplies the frequency signal to the high frequency power supply 273 such that the reflected wave in the transmission line becomes zero.

According to the present embodiment, the resonance coil 212 more accurately form the standing wave since the high frequency power resonating accurately is output by compensating for the deviation of the resonance point in the resonance coil 212 when the plasma is generated and when the conditions for generating the plasma are changed. That is, as shown in FIG. 2, the standing wave in which the phase voltage thereof and the opposite phase voltage thereof are always canceled by each other is generated in the resonance coil 212 by the transmission of an actual resonance frequency of the resonance coil 212 reflecting the influence of the plasma, and the highest phase current is generated at the electric midpoint of the resonance coil 212 (node with zero voltage). Therefore, the induction plasma excited at the electric midpoint is almost not capacitively coupled with the walls of the process chamber 201 or the substrate support. As a result, the donut-shaped plasma with extremely low electric potential is generated in the plasma generation space 201a.

<Controller>

Figure 3:
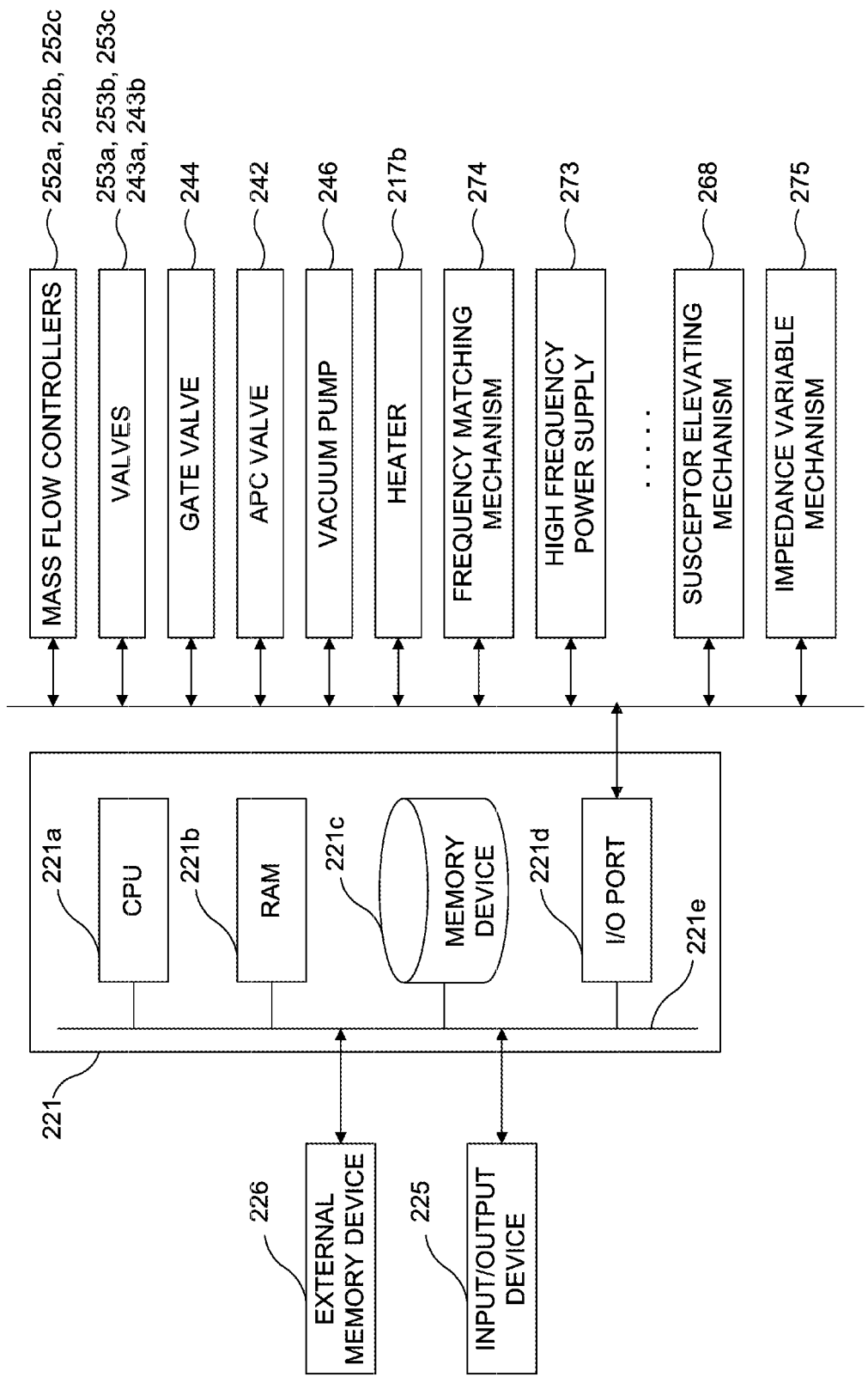
FIG. 3 is a block diagram schematically illustrating a configuration of a controller and related components of the substrate processing apparatus according to the embodiments.

As shown in FIG. 3, a controller 221 serving as a control mechanism is embodied by a computer including a CPU (Central Processing Unit) 221a, a RAM (Random Access Memory) 221b, a memory device 221c and an I/O port 221d. The RAM 221b, the memory device 221c and the I/O port 221d may exchange data with the CPU 221a through an internal bus 221e. For example, an input/output device 225 such as a touch panel, a mouse, a keyboard and an operation terminal (not shown) is connected to the controller 221. A display mechanism such as a display (not shown) may be connected to the controller 221.

The memory device 221c may be embodied by components such as a flash memory, a HDD (Hard Disk Drive) and a CD-ROM. Components such as a control program configured to control the operation of the substrate processing apparatus 100 and a process recipe in which information such as the order and the condition of a substrate processing described later is stored are readably stored in the memory device 221c. The process recipe is obtained by combining steps of the substrate processing described later such that the controller 221 can execute the steps to acquire a predetermine result, and functions as a program. The RAM 221b functions as a memory area (work area) where a program or data read by the CPU 221a is temporarily stored.

The I/O port 221d is electrically connected to the above-described components such as the MFCs 252a, 252b and 252c, the valves 253a, 253b, 253c, 243a and 243b, the gate valve 244, the APC valve 242, the vacuum pump 246, the heater 217b, the RF sensor 272, the high frequency power supply 273, the frequency matching mechanism 274, the susceptor elevating mechanism 268 and the impedance variable mechanism 275.

The CPU 221a is configured to read and execute the control program stored in the memory device 221c, and to read the process recipe stored in the memory device 221c in accordance with an instruction such as an operation command inputted via the input/output device 225. The CPU 221a is configured to control the operation of the substrate processing apparatus 100 according to the process recipe. For example, as shown in FIG. 1, the CPU 221a may be configured to perform the operation, according to the process recipe, such as an operation of adjusting the opening degree of the APC valve 242, an opening/closing operations of the valve 243b and a start and stop of the vacuum pump 246 via the I/O port 221d and a signal line A, an elevating/lowering operation of the susceptor elevating mechanism 268 via the I/O port 221d and a signal line B, a power supply amount adjusting operation (temperature adjusting operation) to the heater 217b by the heater power adjustment mechanism 276 based on the temperature detected by a temperature sensor (not shown) and an impedance adjusting operation by the impedance variable mechanism 275 via the I/O port 221d and a signal line C, an opening/closing operation of the gate valve 244 via the I/O port 221d and a signal line D, a controlling operation of the RF sensor 272, the frequency matching mechanism 274 and the high frequency power supply 273 via the I/O port 221d and a signal line E, and gas flow rate adjusting operations of the MFCs 252a, 252b and 252c and opening/closing operations of the valves 253a, 253b, 253c and 243a via the I/O port 221d and a signal line F.

(2) Substrate Processing

Figure 4A:
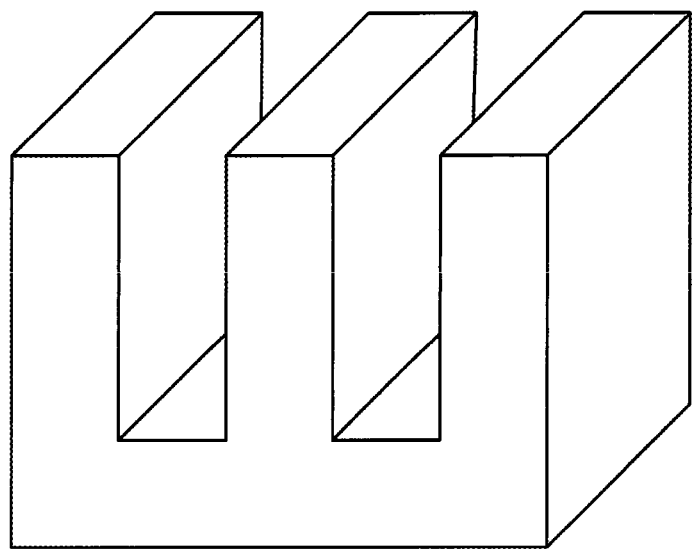
FIG. 4A schematically illustrates an example of a substrate with a concave structure formed thereon to be processed according to a substrate processing of the embodiments described herein, wherein a trench structure is formed on the substrate as the concave structure.
Figure 4B:
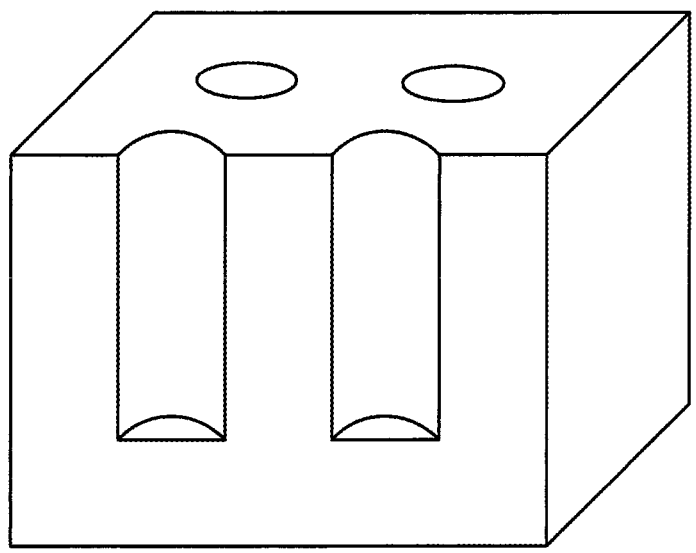
FIG. 4B schematically illustrates another example of the substrate with the concave structure formed thereon to be processed according to the substrate processing of the embodiments described herein, wherein a hole structure is formed on the substrate as the concave structure.
Figure 5:
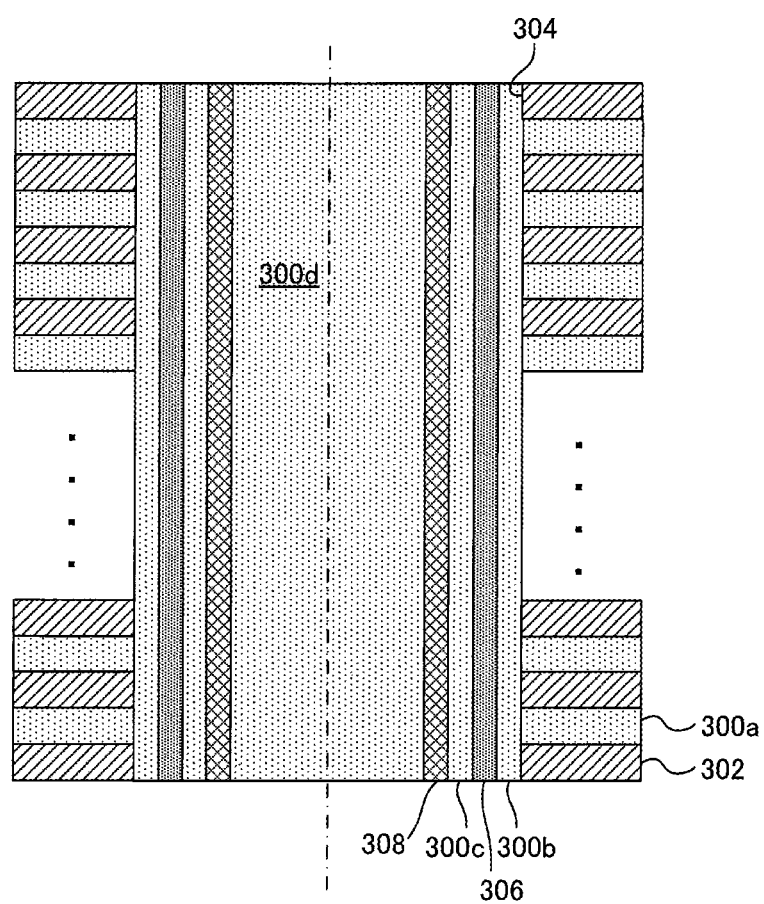
FIG. 5 schematically illustrates an example of a configuration of the substrate shown in FIGS. 4A and 4B.

Hereinafter, the substrate processing according to the present embodiment will be described. FIG. 4A schematically illustrates a substrate with a trench structure formed thereon to be processed according to the substrate processing of the present embodiment, and FIG. 4B schematically illustrates a substrate with a hole structure formed thereon to be processed according to the substrate processing of the present embodiment. FIG. 5 schematically illustrates an example of a configuration of the substrate shown in FIGS. 4A and 4B, that is, an exemplary cross-sectional view of the trench structure or the hole structure in a depth direction thereof. The substrate processing according to the present embodiment is performed by the above-described substrate processing apparatus 100, as one of the manufacturing processes of the semiconductor device such as a flash memory. In the following description, the operations of the components of the substrate processing apparatus 100 are controlled by the controller 221.

For example, as shown in FIG. 5, a pattern with a three-dimensional structure is formed on the substrate with a concave structure such as the trench structure and the hole structure to be processed according to the substrate processing of the present embodiment. Specifically, the structure of the pattern is, for example, a hole-shaped 3D-NAND structure with an aspect ratio (that is, a ratio of a depth of the hole to a diameter of the hole) of 20 or more. The hole-shaped 3D-NAND structure is formed by the following procedures. Hereinafter, substrate processing procedures through which the substrate with the hole structure is formed will be described. In the present specification, the term "aspect ratio" is not limited to the hole structure. For example, the term "aspect ratio" may also refer to a ratio of a depth of the trench to a width of the trench.

First, a titanium nitride film 302 serving as a metal-containing film and a silicon oxide film 300a are alternately and continuously stacked on the wafer 200 serving as the substrate made of a material such as single crystal silicon (c-Si). Then, a stacked film of the titanium nitride film 302 and the silicon oxide film 300a is etched by an etching process from the top to the bottom thereof to form a hole 304 (see FIG. 6A).

Next, a silicon oxide film 300b is formed on an inner surface of the hole 304 (see FIG. 6B).

Next, a silicon nitride film 306 is formed on an inner surface of the silicon oxide film 300b (see FIG. 6C).

Next, a silicon oxide film 300c is formed on an inner surface of the silicon nitride film 306 (see FIG. 6D).

Next, a polysilicon film 308 is formed on an inner surface of the silicon oxide film 300c (see FIG. 6E).

Then, a silicon oxide film 300d is filled inside the polysilicon film 308 to form the hole-shaped 3D-NAND structure (see FIG. 6F), and the polysilicon film 308 is used as a channel part (channel portion).

In the substrate processing procedures, when etching the stacked film shown in FIG. 6A from the top to the bottom thereof to form the hole 304 as described above, as shown in FIG. 7A for example, an exposed surface of the silicon oxide film 300a at a bottom of the hole 304 may be damaged. Therefore, a damaged layer may be formed. In the present specification, the damage to the silicon oxide film 300a mainly means that the oxygen component is removed from the silicon oxide film 300a and the silicon oxide film 300a with the oxygen component is removed does not have a desired composition. That is, an oxygen concentration of the damaged layer is reduced by the etching process. When the silicon oxide film 300a is damaged, the function of the silicon oxide film 300a as an insulating film may be deteriorated. Since the etching process is performed by attracting ions under a bias of electric potential, the damage at the bottom of the hole 304 is most serious. As a result, the degree of the damage is greater at the bottom of the hole 304. In other words, the oxygen concentration of the damaged layer is lowest at the bottom of the hole 304. When the silicon oxide film 300a serving as the insulating film is damaged, the electrical characteristics such as the withstand voltage characteristics may be changed. Therefore, when there is a significant damage to the silicon oxide film 300a at the bottom of the hole 304, variations in the withstand voltage characteristics may occur between the silicon oxide film 300a at the bottom of the hole 304 and the silicon oxide film 300a at the other portions. In addition, when an oxidation process is performed to repair the damage, for example, the silicon oxide film 300a at the other portions with no damage or less damage may be excessively oxidized or an oxidation of a metal-containing film such as a metal gate may be advanced. Therefore, it is preferable that only the vicinity of the bottom of the hole 304 is locally (selectively) oxidized when the damaged silicon oxide film is repaired.

Figure 7B:
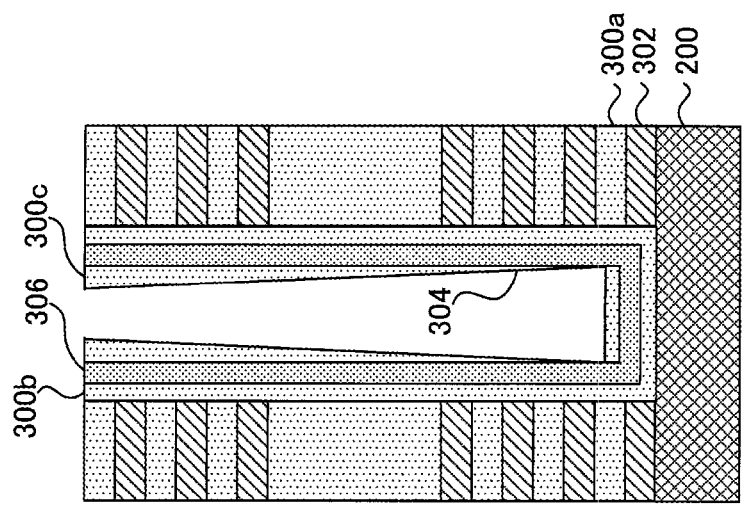
FIGS. 7A and 7B schematically illustrate exemplary cross-sectional views of the concave structure of the substrate to be processed according to the substrate processing of the embodiments described herein.

In addition, for example, when the silicon oxide film 300c shown in FIG. 6D is formed as described above, a thickness of the silicon oxide film 300c may be thick at an upper portion of the hole 304 and may decreases toward the bottom (lower end portion) of the hole 304 due to a microloading effect as shown in FIG. 7B. That is, the thickness of the silicon oxide film 300c may not be uniform between the upper and lower portions of the hole 304. When the thickness of the silicon oxide film 300c is not uniform between the upper portion and the lower portion of the hole 304, variations may occur in the electrical characteristics such as the withstand voltage characteristics. Therefore, in order to adjust the variations in the thickness of the silicon oxide film 300c on the inner surface of the hole 304, an oxidation process may be performed to the inner surface of the hole 304. By performing the oxidation process, for example, on the silicon nitride film 306 serving as a base film (underlying film) of the silicon oxide film 300c such that the thickness of an oxide layer by the oxidation process increases toward the bottom of the hole 304, it is possible to adjust the thickness of the silicon oxide film 300c including the oxide layer formed in the oxidation process to become substantially uniform.

In the present embodiment, in order to address the problems described above, for example, the silicon oxide film which is a film formed on the inner surface of the concave structure with a high aspect ratio of 20 or more such as the trench structure and the hole structure or the silicon nitride film serving as the base film of the silicon oxide film is modified (oxidized) from the surface thereof exposed to an inner space of the hole 304, and the oxide layer is formed such that the thickness of the oxide layer by the modification process described above increases toward the bottom of the hole 304. Thus, it is possible to repair the damage of the silicon oxide film at the bottom of the hole 304, and to adjust the variations in the thickness of the oxide film formed on the inner surface of the hole 304.

Figure 7A:
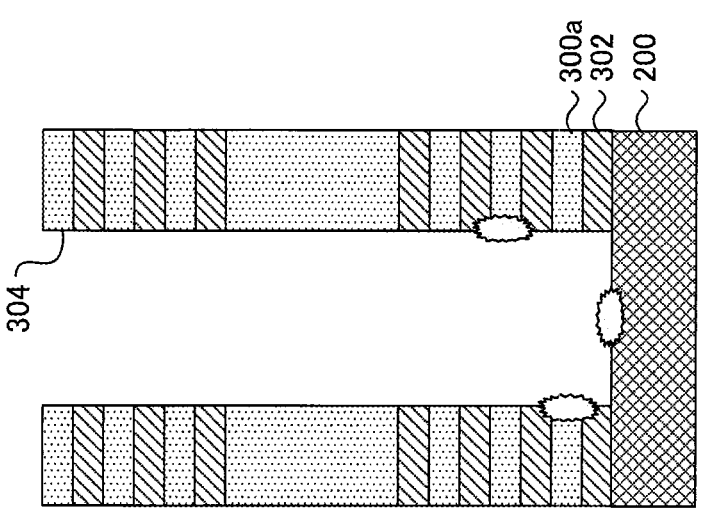

First, an example of repairing the damage of the silicon oxide film 300a at the bottom of the inner surface of the hole 304 as shown in FIG. 7A will be described. For example, the aspect ratio of the hole 304 in the present embodiment is 20.

Figure 8:
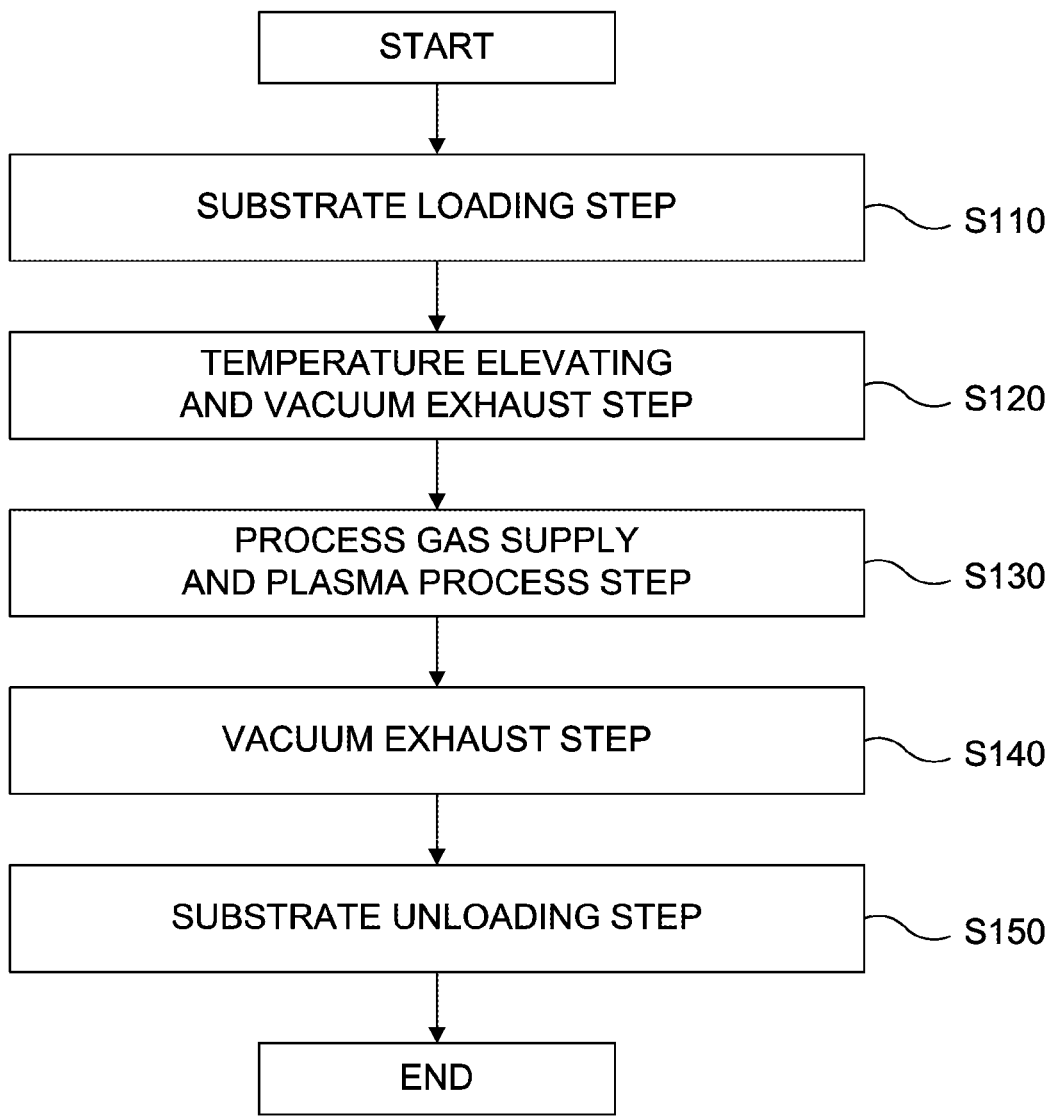
FIG. 8 is a flow chart schematically illustrating the substrate processing according to the embodiments.

After etching the stacked film as shown in FIG. 6A described above, the substrate processing including steps S110 through S150 shown in FIG. 8 is performed.

<Substrate Loading Step S110>

First, the wafer 200 with the hole 304 to be repaired formed on the surface thereof is transferred (loaded) into the process chamber 201. Specifically, the susceptor 217 is lowered to a position for transferring the wafer 200 (also referred to as a "wafer transfer position") by the susceptor elevating mechanism 268. The wafer lift pins 266 penetrate the through-holes 217a of the susceptor 217. As a result, the wafer lift pins 266 protrude from the surface of the susceptor 217 by a predetermined height.

Next, the gate valve 244 is opened and the wafer 200 is loaded into the process chamber 201. As a result, the wafer 200 is horizontally supported by the wafer lift pins 266 protruding from the surface of the susceptor 217. Thereafter, the susceptor elevating mechanism 268 elevates the susceptor 217 until the susceptor 217 is at a predetermined position between the lower end 203a of the resonance coil 212 and an upper end 245a of the substrate loading/unloading port 245. As a result, the wafer 200 is placed on an upper surface of the susceptor 217 and supported by the susceptor 217.

<Temperature Elevating and Vacuum Exhaust Step S120>

Next, a temperature of the wafer 200 loaded into the process chamber 201 is elevated. The heater 217b embedded in the susceptor 217 is heated in advance. By placing the wafer 200 on the susceptor 217 where the heater 217b is embedded, the wafer 200 is heated to a predetermined temperature. For example, the predetermined temperature of the wafer 200 may range from 100° C. to 1,000° C. In the present embodiment, for example, the predetermined temperature of the wafer 200 is 700° C. While the wafer 200 is being heated, the vacuum pump 246 vacuum-exhausts the inside of the process chamber 201 through the gas exhaust pipe 231 such that an inner pressure of the process chamber 201 is at a predetermined pressure. For example, the predetermined pressure may range from 0.5 Pa to 250 Pa, preferably, from 10 Pa to 200 Pa. The vacuum pump 246 vacuum-exhausts the inside of the process chamber 201 at least until a substrate unloading step S150 described later is completed.

<Process Gas Supply and Plasma Process Step S130>

Next, a gas containing hydrogen (H) atoms and oxygen (O) atoms serving as one of the process gases is supplied into the process chamber 201, and a plasma process is performed on the inner surface of the hole 304 by plasma-exciting the gas containing the hydrogen atoms and the oxygen atoms. In the present embodiment, a mixed gas of the $H_2$ gas serving as the hydrogen-containing gas and the $O_2$ gas serving as the oxygen-containing gas is supplied.

Specifically, the valves 243a, 253a and 253b are opened to supply the $H_2$ gas into the process chamber 201 via the buffer chamber 237 while the flow rate of the $H_2$ gas is adjusted by the WC 252a. Simultaneously, the $O_2$ gas is supplied into the process chamber 201 via the buffer chamber 237 while the flow rate of the $O_2$ gas is adjusted by the WC 252b.

In the process gas supply and plasma process step S130, when a modification process is performed with a ratio of the $H_2$ gas to the mixed gas supplied into the process chamber 201 increased to 10% through 50%, a quantitative ratio of a hydrogen active species generated from the mixed gas decreases in the inner space of the hole 304 toward the bottom of the hole 304 further away from an upper end portion of the hole 304 (that is, an opening portion of the hole 304). Although the details will be described later, a ratio of the hydrogen active species to an oxygen active species supplied to the surface of the wafer 200 is controlled in the present embodiment, for example, by controlling a ratio of the flow rate of the $H_2$ gas to the flow rate of the $O_2$ gas in the mixed gas supplied into the process chamber 201, such that an oxidation rate (that is, a rate of forming the oxide layer on the surface of the film to be modified) has a desired distribution in a direction from the upper end portion to the bottom of the hole 304 (that is, in a depth direction). That is, by adjusting the opening degree of each of the MFCs 252a and 252b, a thickness distribution of the oxide layer by the modification process is controlled to have the desired distribution in the depth direction of the hole 304. In particular, the ratio of the flow rate of the $H_2$ gas to the flow rate of the $O_2$ gas in the mixed gas (or the ratio of the hydrogen active species to the oxygen active species) is controlled such that the oxidation rate (or the thickness of the oxide layer) increases toward the bottom of the hole 304 further away from the upper end portion. In addition, by adjusting the conditions such that a ratio of a supply amount of the hydrogen active species to a supply amount of the oxygen active species at the bottom of the hole 304 (or a ratio of the flow rate of the hydrogen active species to the flow rate of the oxygen active species) is about 5:95 (that is, the ratio of hydrogen active species in the total supply amount of the active species is about 5%), it is possible to maximize the oxidation rate at the bottom of the hole 304. In the present embodiment, for example, the amount of the $H_2$ gas supplied into the process chamber 201 is 200 sccm, and the amount of the $O_2$ gas supplied into the process chamber 201 is 800 sccm.

The inside of the process chamber 201 is exhausted by adjusting the opening degree of the APC valve 242 such that the inner pressure of the process chamber 201 is at a predetermined pressure. For example, the predetermined pressure is 150 Pa.

<Plasma Excitation Step>

After a predetermined time elapses from the start of the supply of the mixed gas of the $H_2$ gas and the $O_2$ gas, for example, after several seconds elapse, the high frequency power is applied to the resonance coil 212 from the high frequency power supply 273. For example, the high frequency power of 27.12 MHz ranges from 0.5 KW to 3.5 KW. In the present embodiment, for example, the high frequency power is 2.5 KW. As a result, a donut-shaped induction plasma is excited at a height corresponding to the electric midpoint of the resonance coil 212 in the plasma generation space 201a. The $H_2$ gas and the $O_2$ gas are activated by the excited plasma and dissociate. As a result, the oxygen active species (O radicals) and the hydrogen active species (H radicals) are generated. In addition, as a reactive species containing oxygen atoms, components such as hydroxyl radicals and oxygen ions may be generated, and as a reactive species containing hydrogen atoms, components such as hydrogen ions may be generated.

By processing the surface of the substrate with the H radicals and the O radicals generated by the excited plasma, the film such as the silicon oxide film 300a formed on the inner surface of the hole 304 is modified through the surface thereof and is oxidized to form an oxide layer 400a.

Figure 9A:
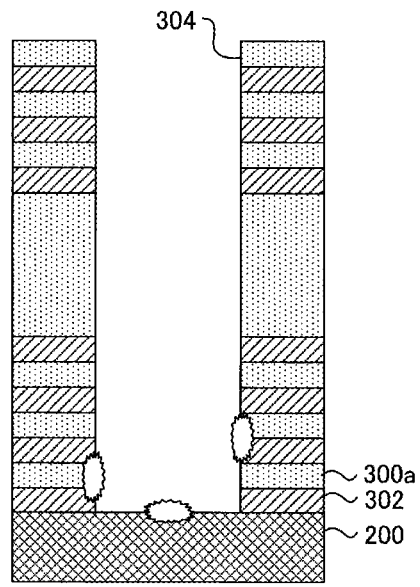
FIG. 9A schematically illustrates an exemplary cross-sectional view of the concave structure of the substrate before performing the substrate processing of the embodiments.
Figure 9B:
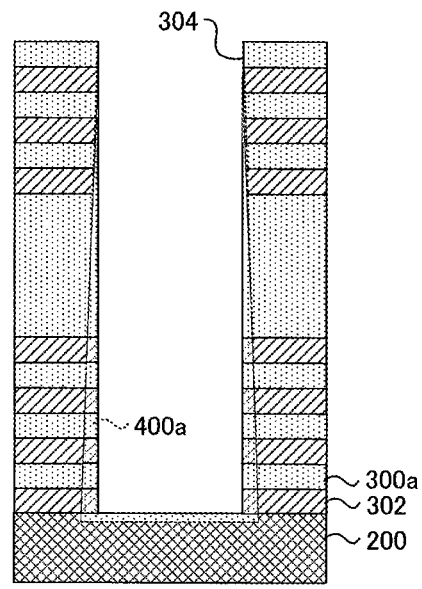
FIG. 9B schematically illustrates an exemplary cross-sectional view of the concave structure of the substrate after performing the substrate processing of the embodiments.

When processing the surface of the substrate with the H radicals and the O radicals, by setting a ratio of the H radicals to the H radicals and the O radicals supplied to the inner surface of the hole 304 to a predetermined ratio, as shown in FIG. 9B, it is possible to form the oxide layer 400a such that a thickness of the oxide layer 400a increases toward the bottom of the hole 304. That is, it is possible to modify the damaged silicon oxide film 300a at the bottom of the hole 304 to form the oxide layer 400a as a repaired silicon oxide film. The reason will be described later.

While the mixed gas of the $H_2$ gas serving as the hydrogen-containing gas and the $O_2$ gas serving as the oxygen-containing gas is used as the gas containing the hydrogen atoms and the oxygen atoms in the present embodiment, the present embodiment is not limited thereto. For example, a mixed gas of the hydrogen-containing gas other than the $H_2$ gas and the oxygen-containing gas other than the $O_2$ gas may be used. For example, $O_3$ (ozone) gas may be used as the oxygen-containing gas. In addition, a gas containing deuterium (D) may be used as the hydrogen-containing gas. In addition, a rare gas such as argon (Ar) may be added if necessary.

In the present embodiment, the ratio of the H radicals to the O radicals supplied into the hole 304 is adjusted to form the oxide layer such that the thickness of the oxide layer relatively increases toward the bottom of the hole 304. In addition, in the present embodiment, in particular, the ratio of the H radicals to the O radicals at the bottom of the hole 304 is adjusted to 5:95 in order to maximize the rate of forming the oxide layer (that is, the oxidation rate) at the bottom of the hole 304. The reason for setting the ratio of the H radicals to the O radicals at the bottom of the hole 304 to 5:95 will be described below.

Figure 10:
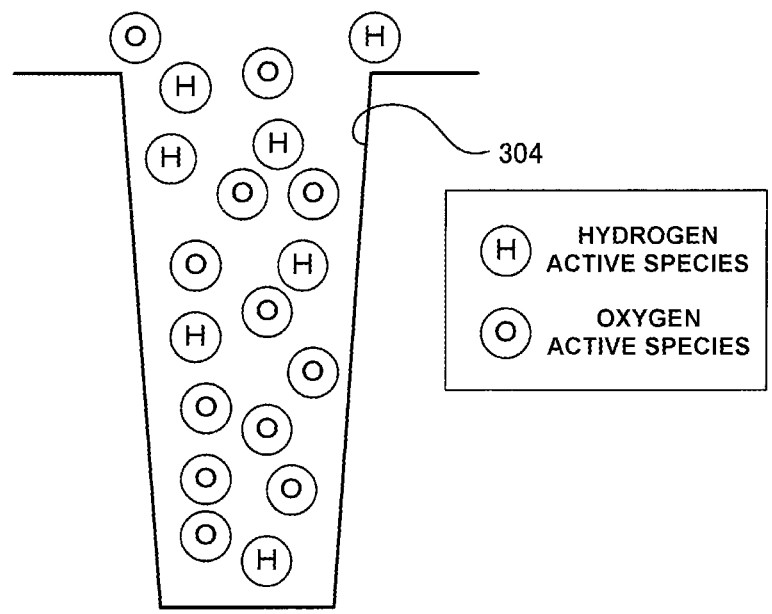
FIG. 10 schematically illustrates a hydrogen active species and an oxygen active species in a hole 304.

FIG. 10 schematically illustrates the H radicals and the O radicals in the hole 304. FIG. 11 schematically illustrates a relationship between a $H_2$ ratio and a thickness of an oxide layer formed on an upper surface of a planar wafer on which no structure such as the concave structure is formed. The oxide layer is formed by performing the same oxidation process as in the present embodiment to a silicon film formed on the planar wafer, and the $H_2$ ratio indicates a ratio of a flow rate of the $H_2$ gas to a total flow rate of the $H_2$ gas and the $O_2$ gas supplied into the process chamber 201 where the planar wafer is accommodated. That is, FIG. 11 schematically illustrates the relationship between the ratio of the flow rate of the $H_2$ gas to the total flow rate of the $H_2$ gas and the $O_2$ gas and the thickness of the oxide layer formed on the film to be modified when no concave structure exists on the planar wafer.

In general, the H radicals are more likely to be deactivated than the O radicals, and have a shorter life. Therefore, when the collision with components such as the wall of the hole 304 occurs while entering the bottom of the hole 304 through the upper end portion (opening portion) of the hole 304, the H radicals tend to be deactivated faster than the O radicals. Due to the difference between the lifetimes of the H radicals and the O radicals, the ratio of the H radicals at the bottom of the hole 304 is lower than that of the H radicals at the upper end portion of the hole 304.

As shown in FIG. 11, when the oxide layer is formed by using the mixed gas of the $H_2$ gas and the $O_2$ gas, the oxidation rate reaches its peak when the $H_2$ ratio in the mixed gas is around 5%. When the $H_2$ ratio in the mixed gas is higher than 5%, the oxidation rate tends to decrease. In addition, as shown in FIG. 11, even when the $H_2$ ratio in the mixed gas is lower than 5%, the oxidation rate tends to decrease. That is, the oxidation rate is highest when the $H_2$ ratio in the mixed gas is around 5%.

In the present embodiment, it is assumed that the ratio of the $H_2$ gas to the $O_2$ gas supplied into the process chamber 201 before the plasma excitation and the ratio of the H radicals to the O radicals supplied on the surface of the wafer (substrate) are substantially equal. Therefore, it is considered that the oxidation rate is highest when the ratio of the H radicals to the O radicals supplied to the film to be modified is about 5:95 (that is, the ratio of the H radicals is about 5%).

When the H radicals to the O radicals are supplied to an upper surface of the wafer 200 (in which the hole 304 is formed) at the ratio which maximizes the oxidation rate of the silicon film formed on the planar wafer with no concave structure is formed on the surface thereof as shown in FIG. 11, an oxidation rate becomes the largest at the upper end portion of the hole 304 (the opening portion of the hole 304), and the oxidation rate decreases as the ratio of the H radicals decreases toward the bottom of the hole 304. Therefore, by setting (adjusting) the ratio of the H radicals to the O radicals supplied to the wafer 200 to a predetermined ratio greater than the ratio (first ratio) at which the oxidation rate at the upper end portion of the hole 304 is maximized, it is possible to form the oxide layer such that the thickness of the oxide layer at the inner surface of the hole 304 (that is, a surface closer to the bottom than the upper end portion) is greater than that of the oxide layer at the upper end portion of the hole 304. For example, according to the present embodiment, by setting (adjusting) the ratio of the flow rate of the $H_2$ gas in the mixed gas supplied into the process chamber 201 to a predetermined ratio higher than 5% at which the oxidation rate peaks at the upper end portion of the hole 304, it is possible to adjust the thickness of the oxide layer such that the thickness of the oxide layer on the inner surface of the hole 304 is greater than that of the upper end portion of the hole 304.

In addition, by setting (adjusting) the ratio of the H radicals to the O radicals supplied to the upper surface of the wafer 200 to a predetermined ratio greater than a ratio (second ratio) at which a thickness distribution of the oxide layer in the depth direction toward the bottom of the hole 304 (that is, a distribution of the oxidation rate) is substantially uniform, it is possible to form the oxide layer such that the thickness of the oxide layer becomes relatively greater toward the bottom of the hole 304 compared with that of the oxide layer of the substantially uniform distribution. For example, according to the present embodiment, the ratio of the flow rate of the $H_2$ gas in the mixed gas supplied into the process chamber 201 is set (adjusted) to the predetermined ratio greater than the ratio at which the thickness distribution of the oxide layer is substantially uniform. The second ratio is greater than the first ratio.

In addition, by setting (adjusting) the ratio of the H radicals to the O radicals supplied to the upper surface of the wafer 200 to the predetermined ratio equal to or greater than a ratio (third ratio) at which the oxidation rate at the bottom of the hole 304 is maximized, it is possible to form the oxide layer such that the thickness of the oxide layer relatively increases toward the bottom of the hole 304 and the thickness of the oxide layer is maximized at the bottom of the hole 304 in the thickness distribution of the oxide layer on the inner surface of the hole 304. In particular, by setting the ratio of the H radicals to the O radicals supplied to the upper surface of the wafer 200 to the third ratio, it is possible to maximize the oxidation rate at the bottom of the hole 304.

When the ratio of the H radicals to the O radicals at the bottom of the hole 304 is around 5%, the oxidation rate at the bottom of the hole 304 is maximized. Therefore, the third ratio described above is a ratio that the ratio of the H radicals to the O radicals at the bottom of the hole 304 is around 5%. The third ratio is greater than the first ratio and the second ratio.

For example, in order to set the ratio of the supply amount of the H radicals at the bottom of the hole 304 with an aspect ratio of 20 to about 5%, it is preferable that the ratio of the supply amount of the H radicals at the upper end portion of the hole 304, that is, the third ratio, may be set to about 10% to 30%, for example, about 20%. In the present embodiment, the ratio of the flow rate of the $H_2$ gas to the flow rate of the $O_2$ gas introduced (supplied) into the process chamber 201 is adjusted to 10:90 through 30:70 in order to set the ratio of the supply amount of the H radicals at the upper end portion of the hole 304 to 10% to 30%.

In order to achieve the ratio of the H radicals such that the oxidation rate at the bottom of the hole 304 is maximized, it is necessary to increase the ratio of the H radicals supplied to the upper end portion of the hole 304 as the aspect ratio of the substrate increases. The higher the aspect ratio, the higher the probability that the H radicals are deactivated before reaching the bottom of the hole 304. When the H radicals are completely deactivated before reaching the bottom of the hole 304, the oxidation rate is lower than the peak value.

After a predetermined process time elapses from the start of the application of the high frequency power, the output of the power from the high frequency power supply 273 is stopped to stop the plasma discharge in the process chamber 201. The valves 253a and 253b are closed to stop the supply of the $H_2$ gas and the $O_2$ gas into the process chamber 201.

<Vacuum Exhaust Step S140>

After the predetermined process time elapses and the supply of the $H_2$ gas and the $O_2$ gas is stopped, the inside of the process chamber 201 is vacuum-exhausted by using the gas exhaust pipe 231. As a result, an exhaust gas such as the $H_2$ gas, the $O_2$ gas and other residues in the process chamber 201 is exhausted to the outside of the process chamber 201. Thereafter, the opening degree of the APC valve 242 is adjusted such that the inner pressure of the process chamber 201 is adjusted to the same pressure as that of a vacuum transfer chamber (not shown).

<Substrate Unloading Step S150>

After the inner pressure of the process chamber 201 reaches a predetermined pressure, the susceptor 217 is lowered to the wafer transfer position described above until the wafer 200 is supported by the wafer lift pins 266. Then, the gate valve 244 is opened and the wafer 200 is unloaded from the process chamber 201 to the outside of the process chamber 201 by using a transfer mechanism (not shown). Thereby, the substrate processing according to the present embodiment is completed.

As described above, by performing the modification process using the hydrogen active species and the oxygen active species in a predetermined ratio, it is possible to adjust the thickness of the oxide layer 400a formed on the surface of the silicon oxide film 300a at the bottom of the hole 304 to become relatively greater than the thickness of the oxide layer 400a formed on the surface of the silicon oxide film 300a at the upper portion of the hole 304. Therefore, it is possible to improve the electrical characteristics (for example, the withstand voltage characteristics) by selectively repairing the silicon oxide film 300a at the bottom of the hole 304 damaged by the etching process.

Hereinafter, an example of adjusting the variations of the thickness of the oxide film formed on the inner surface of the hole 304 as shown in FIG. 7B will be described.

After forming the silicon oxide film 300c as shown in FIG. 6D described above, the substrate processing including steps S110 through S150 described above is performed.

By performing the steps S110 through S150 described above, as shown in FIG. 12B, a silicon oxynitride layer (SiON layer) 400b is formed by selectively modifying (oxidizing) a portion of the silicon nitride film 306 serving as the base film at a location where the silicon oxide film 300c is thin at the bottom of the hole 304. That is, a total thickness of the silicon oxide film 300c formed at the bottom of the hole 304 and the silicon oxynitride layer 400b formed therebelow is adjusted so as to approach a thickness of the silicon oxide film 300c at the upper end portion of the hole 304. It is thought that the silicon oxynitride layer 400b becomes similar to the silicon oxide layer as nitrogen contained in the silicon oxynitride layer 400b escapes gradually therefrom.

While the present embodiment described above is mainly described by way of an example in which the ratio of the supply amount of the H radicals to the supply amount of the O radicals is adjusted such that the oxidation rate is maximized at the bottom of the hole 304, the present embodiment is not limited to the example in which the oxidation rate is maximized at the bottom of the hole 304. For example, by adjusting the ratio of the supply amount of the H radicals, it is possible to perform the modification process to maximize the oxidation rate at any position in the depth direction of the hole 304. That is, it is possible to arbitrarily adjust the thickness distribution of the oxide layer formed by the modification process in the depth direction. In particular, by setting the ratio of the H radicals to the O radicals supplied to the wafer greater than a reference ratio at which the thickness distribution of the oxide layer in the depth direction of the hole 304 is substantially uniform, it is possible to obtain a distribution in which the thickness of the oxide layer increases toward the bottom of the hole 304.

In addition, in the present embodiment described above, by adjusting the ratio of the flow rate of the hydrogen-containing gas to the flow rate of the oxygen-containing gas supplied into the process chamber 201 by controlling the opening degree of each of the MFCs 252a and 252b, the ratio of the H radicals to the O radicals supplied into the hole 304 is adjusted. However, the ratio of the supply amount of the H radicals to the supply amount of the O radicals may also be adjusted by changing the distance between the wafer 200 and the resonance coil 212 by controlling the susceptor elevating mechanism 268.

Alternatively, the mixed gas may be plasma-excited outside the process chamber 201, and the generated reactive species such as the active species may be introduced (supplied) into the process chamber 201. In addition, as another example, a quantitative ratio of the active species may be controlled by separately plasma-exciting the $H_2$ gas and the $O_2$ gas and by adjusting a ratio of the flow rates of the active species generated respectively therefrom when the active species are introduced into the process chamber 201.

(3) Second Embodiment

Hereinafter, another embodiment (second embodiment) in which the oxide layer is formed such that the thickness of the oxide layer increases toward the bottom by modifying the film formed on the inner surface of the concave structure with a high aspect ratio such as the trench structure and the hole structure from the surface thereof will be described.

In the second embodiment, by controlling the flow velocity of the gas flowing on the upper end portion of the hole 304 (more generally, the flow velocity of the gas flowing on the upper surface of the wafer 200), it is possible to form the oxide layer by the modification process of the hole 304 with a high aspect ratio such that the thickness of the oxide layer increases toward the bottom of the hole 304.

Specifically, by controlling the flow rate of the mixed gas of the $H_2$ gas and the $O_2$ gas supplied into the process chamber 201 in the process gas supply and plasma process step S130 described above, it is possible to control the flow velocity of the gas flowing on the upper end portion of the hole 304.

<Process Gas Supply and Plasma Process Step S130>

The valves 243a, 253a and 253b are opened to supply the $H_2$ gas into the process chamber 201 via the buffer chamber 237 while the flow rate of the $H_2$ gas is adjusted by the MFC 252a. Simultaneously, the $O_2$ gas is supplied into the process chamber 201 via the buffer chamber 237 while the flow rate of the $O_2$ gas is adjusted by the MFC 252b. When the $H_2$ gas and the $O_2$ gas are supplied into the process chamber 201, a total flow rate of the $H_2$ gas and the $O_2$ gas is set to a predetermined flow rate ranging from 0.5 slm to 3 slm.

The inside of the process chamber 201 is exhausted by adjusting the opening degree of the APC valve 242 such that the inner pressure of the process chamber 201 is at a predetermined pressure ranging from 50 Pa to 200 Pa. For example, the predetermined pressure is 150 Pa. As described above, while exhausting the inside of the process chamber 201 appropriately, the mixed gas of the $H_2$ gas and the $O_2$ gas is continuously supplied until the plasma excitation step described later is completed.

<Plasma Excitation Step>

Similar to the first embodiment, after the mixed gas of the $H_2$ gas and the $O_2$ gas is introduced (supplied), the high frequency power is applied to the resonance coil 212 from the high frequency power supply 273.

By processing the surface of the substrate with the H radicals and the O radicals generated by the excited plasma, the silicon oxide film 300a formed on the inner surface of the hole 304 is modified from the surface thereof to form the oxide layer 400a as shown in FIG. 9B. In addition, by modifying the portion of the silicon nitride film 306 serving as the base film at the location where the silicon oxide film 300c is thin at the bottom of the hole 304 to form the silicon oxynitride layer (SiON layer) 400b as shown in FIG. 12B.

Figure 13:
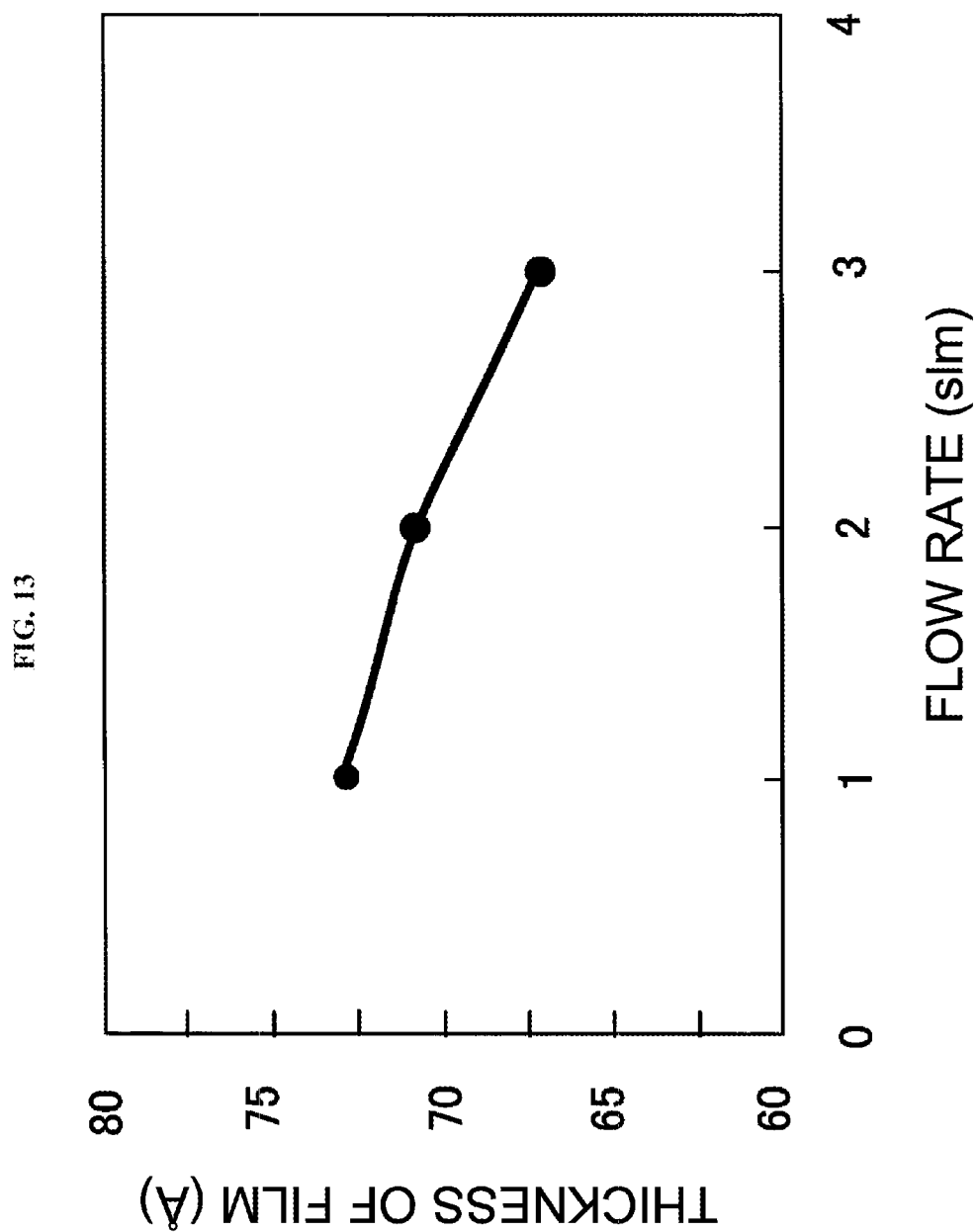
FIG. 13 schematically illustrates a relationship between the total flow rate of the $H_2$ gas and the $O_2$ gas supplied into the process chamber and the thickness of the oxide layer formed on the upper surface of the planar wafer.

FIG. 13 schematically illustrates a relationship between the total flow rate of the mixed gas of the $H_2$ gas and the $O_2$ gas supplied into the process chamber 201 and the thickness of the oxide layer formed on the upper surface of the planar wafer on which no structure such as the concave structure is formed. The oxide layer is formed by performing the same oxidation process as in the present embodiment to the silicon film formed on the planar wafer. Since the inner pressure of the process chamber 201 is constant, the flow rate of the mixed gas supplied into the process chamber 201 and the flow velocity of the gas flowing on the upper surface of the planar wafer are substantially proportional to each other.

Therefore, as shown in FIG. 13, it can be seen that the thickness of the oxide layer formed by the modification process tends to decrease when the flow velocity of the gas flowing on the surface of the film to be modified is fast, and the thickness of the oxide layer formed by the modification process tends to increase when the flow velocity of the gas flowing on the surface of the film to be modified is slow.

Figure 14A:
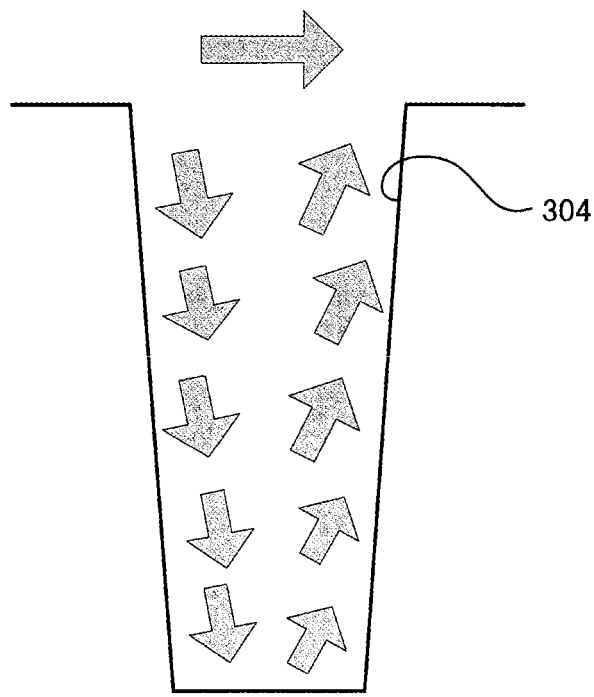
FIGS. 14A and 14B schematically illustrate a relationship between a flow velocity of a gas on an upper end portion of the hole 304 and a flow velocity of the gas in the hole 304.
Figure 14B:
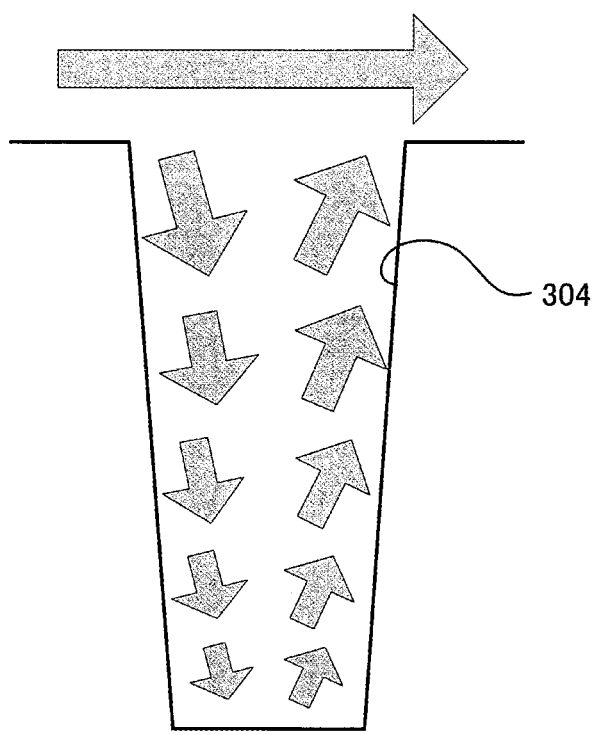

FIGS. 14A and 14B schematically illustrate a relationship between the flow velocity of the gas on the upper end portion of the hole 304 and the flow velocity of the gas containing the H radicals and the O radicals in the hole 304. Directions of arrows shown in FIGS. 14A and 14B indicate flow directions of the gas at positions of the arrows, and the sizes of the arrows indicate the flow velocities of the gas at the positions of the arrows. As shown in FIG. 14B, when the flow velocity of the gas at the upper end portion of the hole 304 (that is, the flow velocity of the gas flowing on the surface of the wafer 200) increases, the flow velocity of the gas relatively decreases toward the bottom of the hole 304 where the flow velocity of the gas is lower than that of the gas at the upper end portion of the hole 304. That is, it can be seen that the difference of the flow velocity of the gas increases as it approaches the bottom of the hole 304 from the upper end portion of the hole 304, and a residence time of the H radicals and the O radicals in the hole 304 is longer than that of the H radicals and the O radicals on the upper portion of the hole 304. As shown in FIG. 14A, when the flow velocity of the gas at the upper end portion of the hole 304 is slow, it can be seen that the difference of the flow velocity of the gas on the upper end portion and the bottom (lower end portion) of the hole 304 is small since the gas flowing in the hole 304 decelerates due to a frictional resistance with the inner surface of the hole 304.

That is, in the wafer with the hole 304, as shown in FIG. 14B, by increasing the flow velocity of the gas at the upper end portion of the hole 304 to a high velocity compared with the flow velocity of the gas at the upper end portion of the hole 304 as shown in FIG. 14A, the residence time of the H radicals and the O radicals becomes relatively longer toward the bottom of the hole 304 as compared with that of the H radicals and the O radicals at the upper end portion of the hole 304. Therefore, the oxidation rate of the film increases as it approaches the bottom of the hole 304 from the upper end portion of the hole 304, and it is considered that the thickness of the oxide layer at the bottom of the hole 304 is thicker than that of the oxide layer at the upper end portion of the hole 304. That is, by selecting the flow velocity of the gas at the upper end of the hole 304, it is possible to form the oxide layer on the inner surface of the hole 304 such that the thickness distribution of the oxide layer on the inner surface of the hole 304 varies in the depth direction. In particular, by setting the flow velocity of the oxygen active species and the hydrogen active species flowing on the upper end portion of the hole 304 to a predetermined flow velocity greater than a flow velocity at which the thickness distribution of the oxide layer in the depth direction of the hole 304 is uniform, it is possible to form the oxide layer such that the thickness of the oxide layer increases toward the bottom of the hole 304.

In addition, when the total flow rate of the gas used for the oxidation process is increased while maintaining the inner pressure of the process chamber 201 at a constant pressure, a discharge rate of the gas discharge is also increased, and the flow rate of the gas flowing on the surface of the substrate is also increased. Therefore, in the present embodiment, by adjusting the flow rate of the mixed gas supplied into the process chamber 201, it is possible to adjust the flow velocity of the gas flowing on the surface of the substrate such that the thickness distribution of the film inside the hole 304 varies in the depth direction. More specifically, by controlling the opening degree of each of the MFCs 252a and 252b, the flow rate of the mixed gas is adjusted. In addition, when controlling the opening degree of each of the MFCs 252a and 252b, as in the first embodiment, the thickness distribution of the film inside the hole 304 is also controlled by simultaneously controlling the ratio of the flow rates of the hydrogen-containing gas and the oxygen-containing gas supplied into the process chamber 201.

In order to form the film at the inner surface of the hole 304 with a desired thickness distribution, data of the thickness distribution of the film formed for each of the flow rates of the gas is recorded in the memory device 221c or an external memory device 226. Then, in order to obtain the desired thickness distribution of the film on the substrate with the concave structure such as the hole structure and the trench structure formed thereon, a predetermined flow rate of the gas is selected to perform the substrate processing (film-forming process).

In the second embodiment, the same gases as those in the first embodiment may be used. In addition, as the gas containing the hydrogen atoms and the oxygen atoms, a gas of a molecule containing both the hydrogen atom and the oxygen atom may be supplied and the gas may be plasma-excited. For example, a gas such as $H_2O$ gas and $H_2O_2$ gas may be used as the gas of the molecule containing both the hydrogen atom and the oxygen atom.

While the second embodiment is described by way of an example in which the ratio of the flow velocity of the mixed gas of the $H_2$ gas and the $O_2$ gas is controlled, the second embodiment is not limited thereto. For example, the second embodiment may be applied to an example in which only the $O_2$ gas, only the $H_2$ gas, only the $N_2$ gas, only ammonia gas, or a mixed gas of the $N_2$ gas and the $H_2$ gas is used as the process gas.

While the second embodiment is described by way of an example in which the flow velocity of the gas is controlled by controlling the total flow rate of the mixed gas supplied into the process chamber 201, the second embodiment is not limited thereto. For example, the flow velocity of the gas at the upper end portion of the hole 304 may be controlled by adjusting the height of the susceptor 217 or by changing the shape in the process chamber 201.

(4) Experimental Examples

<First Experiment>

Figure 15C:
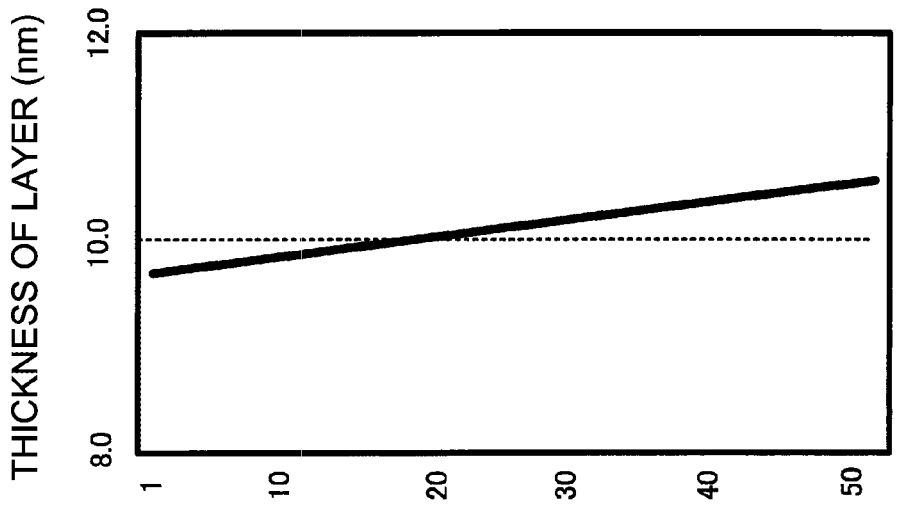
FIG. 15C schematically illustrates a thickness of an oxide layer on the inner surface of the hole pattern shown in FIG. 15A according to the embodiments.
Figure 15B:
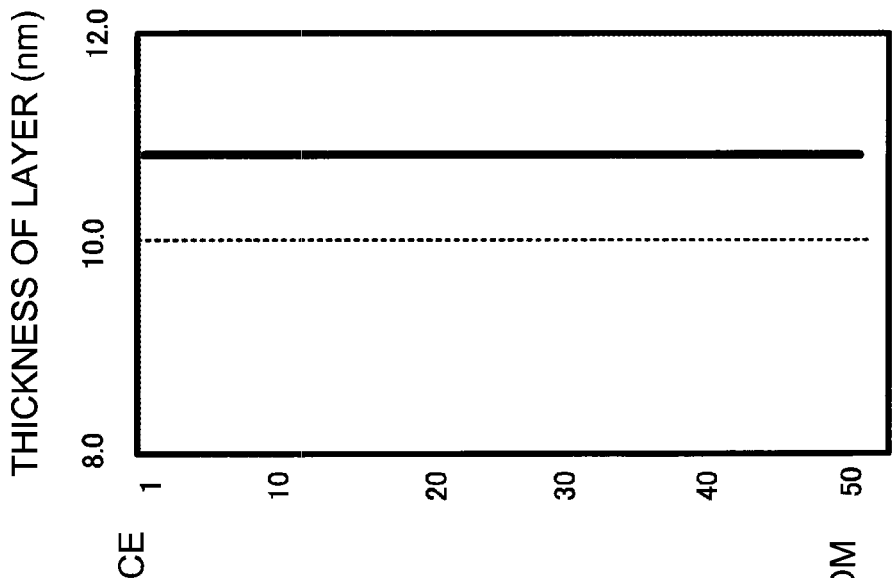
FIG. 15B schematically illustrates a thickness of an oxide layer on an inner surface of the hole pattern shown in FIG. 15A according to a comparative example.
Figure 15A:
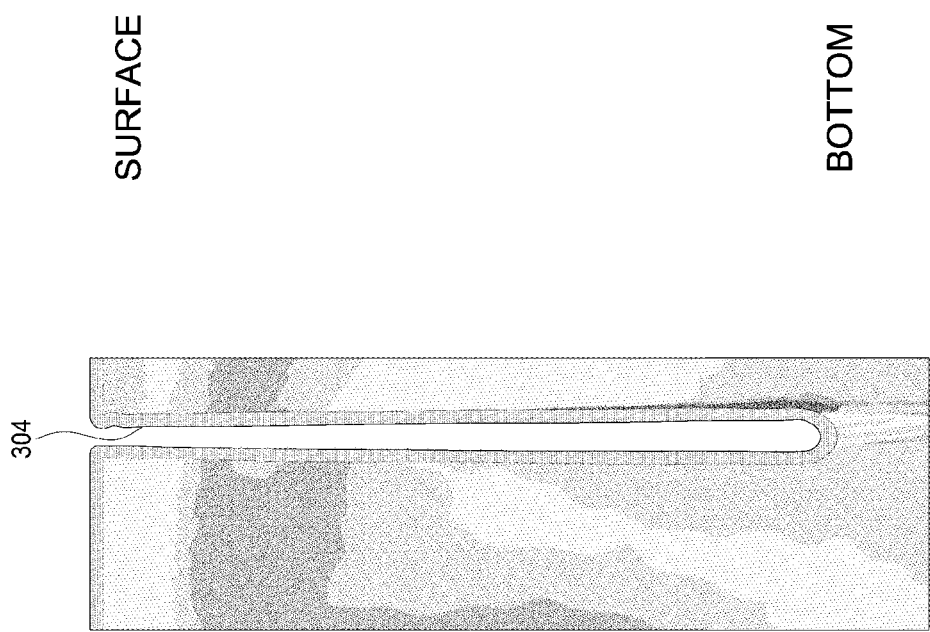
FIG. 15A schematically illustrates an example of a hole pattern with an aspect ratio of 20.

FIG. 15A schematically illustrates an example of a hole pattern. FIG. 15B schematically illustrates a thickness of an oxide layer formed on an inner surface of the hole pattern shown in FIG. 15A by a modification process according to a comparative example. FIG. 15C schematically illustrates a thickness of an oxide layer formed on the inner surface of the hole pattern by the modification process according to an example of the embodiments.

As the comparative example, FIG. 15B schematically illustrates the thickness of the oxide layer when the plasma process of the substrate processing described above is performed using the mixed gas of the $H_2$ gas and the $O_2$ gas, more specifically, when the plasma process is performed using the mixed gas supplied into the process chamber with the ratio of the flow rate of the $H_2$ gas to the ratio of the flow rate of the $O_2$ gas is 5:95. FIG. 15C schematically illustrates the thickness of the oxide layer when the plasma process of the substrate processing described above is performed using the mixed gas supplied into the process chamber with the ratio of the flow rate of the $H_2$ gas to the ratio of the flow rate of the $O_2$ gas is 20:80. In the comparative example and the example of the embodiments, the plasma process is performed to the wafer with the hole with the aspect ratio of 20 at the temperature of the wafer of 700° C., the inner pressure of the process chamber 201 of 150 Pa and an excitation power of 3.5 kW.

As shown in FIG. 15B, when the ratio of the $H_2$ gas to the $O_2$ gas is 5:95, the tendency of the thickness of the oxide layer increasing toward the bottom of the hole 304 is not observed. However, as shown in FIG. 15C, when the ratio of the $H_2$ gas to the $O_2$ gas is 20:80, the thickness of the oxide layer tends to increase toward the bottom of the hole 304, and tends to be largest at the bottom of the hole 304. In addition, according to the example of the embodiments, it is confirmed that the thickness of the oxide layer in the vicinity of the upper end portion of the hole 304 tends to be thinner than that of the oxide layer in the vicinity of the upper end portion of the hole 304 of the comparative example.

That is, when the ratio of the $H_2$ gas to the $O_2$ gas supplied into the process chamber 201 is 20:80, it is assumed that the ratio of the H radicals to the O radicals supplied on the bottom of the hole 304 approaches 5:95. Thus, it is confirmed that a ratio of the H radicals supplied to the bottom (lower end portion) of the hole 304 and a ratio the H radicals supplied to the upper end portion of the hole 304 can be changed by utilizing the fact that the H radicals have a shorter life than the O radicals.

<Second Experiment>

Figure 16B:
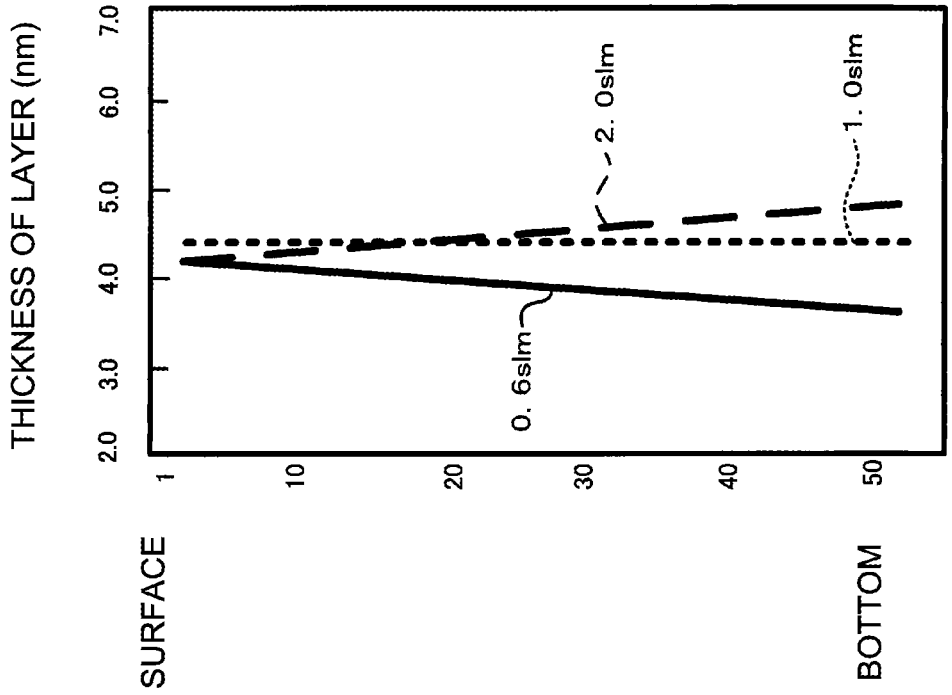
FIG. 16B schematically illustrates a thickness of an oxide layer on an inner surface of the hole pattern shown in FIG. 16A when the oxide layer is formed with a flow rate of the mixed gas of the $H_2$ gas and the $O_2$ gas supplied into the process chamber is set to 1.0 slm, 0.6 slm and 2.0 slm, respectively.
Figure 16A:
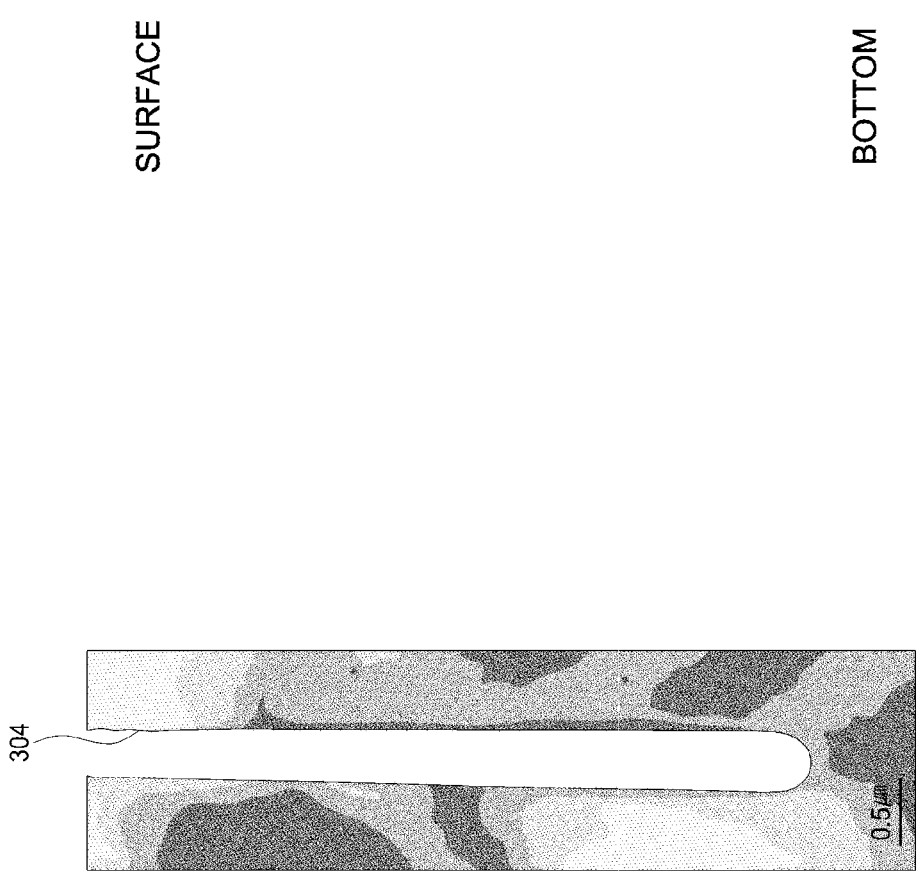
FIG. 16A schematically illustrates another example of a hole pattern with an aspect ratio of 20.

FIG. 16A schematically illustrates an example of a hole pattern with an aspect ratio of 20. FIG. 16B schematically illustrates a thickness of an oxide layer on an inner surface of the hole pattern shown in FIG. 16A when the oxide layer is formed with the flow rate of the mixed gas of the $H_2$ gas and the $O_2$ gas supplied into the process chamber is set to 1.0 slm, 0.6 slm and 2.0 slm, respectively.

As shown in FIG. 16B, when the oxide layer is formed with the flow rate of the mixed gas of 0.6 slm, the O radicals are deactivated before reaching the bottom of the hole 304, and the thickness of the oxide layer decreases toward the bottom of the hole 304. When the oxide layer is formed with the flow rate of the mixed gas of 1.0 slm, a sufficient amount of the radicals can reach the bottom of the hole 304 before the O radicals are deactivated, and the oxide layer is uniformly formed in the depth direction of the holes 304. Then, when the oxide layer is formed with the flow rate of the mixed gas of 2.0 slm, the effect of the difference of the flow velocity between the upper end portion and the bottom of the hole 304 becomes significant, and the thickness of the oxide layer increases toward the bottom of the hole 304 due to the difference in the residence time of the radicals.

That is, when the flow rate is increased (the flow velocity is increased) as compared to the flow rate of 1.0 slm of the mixed gas at which the oxide layer is formed such that the thickness of the oxide layer is uniform toward the bottom of the hole 304, it is confirmed that the oxide layer is formed such that the thickness of the oxide layer tends to increase toward the bottom of the hole 304. That is, by controlling the flow rate of the mixed gas such that the flow velocity of the gas flowing on the upper end portion of the hole is controlled to a high velocity and by allowing the gas to stay in the hole due to the difference of the flow rate of the gas in the hole, it is confirmed that the thickness of the oxide layer formed at the bottom (lower end portion) of the hole can be increased compared to that of the oxide layer formed at the upper end portion of the hole.

That is, according to the first embodiment and the second embodiment described above, by processing the surface of the substrate with the hole 304 formed thereon at a predetermined flow rate of the gas or at a predetermined mixing ratio of the gas, it is possible to arbitrarily control the thickness distribution of the film on the inner surface of the hole in the depth direction.

That is, by modifying the surface of the film such that the thickness of the film becomes thicker (increases) toward the bottom of the hole 304 to form the oxide layer, it is possible to solve the problems described above such as the problem that the oxide film at the bottom of the hole is easily damaged and the problem that the thickness of the film becomes uneven (not uniform) between the upper end portion of the hole 304 and the bottom (lower end portion) of the hole 304 due to the microloading effect. It is also possible to improve the electrical characteristics of the semiconductor device.

The technique described herein is applied to the manufacture of components such as a 3D-NAND flash memory in the manufacturing processes of the semiconductor device, and is also applied to the processing of a surface on which one of a silicon-containing film and a metal-containing film (or a combination thereof) is exposed.

As the silicon-containing film, for example, a film such as a silicon film, a silicon oxide film, a silicon nitride film, an amorphous silicon film and a polysilicon film may be applied.

As the metal-containing film, for example, a film such as a tungsten film, a titanium film, a titanium nitride film, an aluminum oxide film and a hafnium oxide film may be applied.

While the embodiments are described by way of an example in which the substrate with the hole structure is used, the technique is not limited thereto. For example, the technique described herein may be applied to a substrate on which a structure with an aspect ratio of 20 or more such as the trench structure, a slit-shaped groove and a cylindrical pore is formed. In addition, the larger the aspect ratio, the larger the difference in the thickness distribution of the film formed in the concave structure.

According to some embodiments in the present disclosure, it is possible to improve the electrical characteristics of the semiconductor device by adjusting the thickness of the modified layer in the depth direction of the concave structure such that the thickness of the modified layer has a desired distribution when the film formed on the inner surface of the concave structure with a high aspect ratio is modified from the surface of the film to form the modified layer.

What is claimed is:

1. A method of manufacturing a semiconductor device comprising:

(a) generating an oxygen active species and a hydrogen active species by exciting a process gas containing an oxygen-containing gas and a hydrogen-containing gas; and (b) forming an oxide layer by supplying the oxygen active species and the hydrogen active species to a substrate with a concave structure formed thereon to subject a film formed on an inner surface of the concave structure to oxidation from a surface of the film, wherein the oxide layer is formed in (b) such that a thickness of the oxide layer on the inner surface of the concave structure is greater than that of the oxide layer at an upper end portion of the concave structure by setting a ratio of a flow rate of the hydrogen active species to a total flow rate of the oxygen active species and the hydrogen active species supplied to the substrate to a predetermined ratio greater than a first ratio at which a rate of forming the oxide layer is maximized at the upper end portion of the concave structure.

2. The method of claim 1, wherein the oxide layer is formed in (b) such that the thickness of the oxide layer increases toward a bottom of the concave structure by setting the ratio of the flow rate of the hydrogen active species to the total flow rate of the oxygen active species and the hydrogen active species supplied to the substrate to the predetermined ratio greater than a second ratio at which a thickness distribution of the oxide layer in a depth direction of the concave structure is uniform.

3. The method of claim 1, wherein the oxide layer is formed in (b) such that the thickness of the oxide layer increases toward a bottom of the concave structure and is maximized at the bottom of the concave structure by setting the ratio of the flow rate of the hydrogen active species to the total flow rate of the oxygen active species and the hydrogen active species supplied to the substrate to the predetermined ratio equal to or greater than a third ratio at which the rate of forming the oxide layer is maximized at the bottom of the concave structure.

4. The method of claim 3, wherein the third ratio is greater than the first ratio.

5. The method of claim 1, wherein a ratio of a flow rate of the hydrogen-containing gas to a total flow rate of the process gas is set in (a) such that a ratio of the hydrogen active species generated in (a) to a total of the oxygen active species and the hydrogen active species generated in (a) is equal to the predetermined ratio.

6. The method of claim 3, wherein a ratio of a flow rate of the hydrogen-containing gas to a total flow rate of the process gas is set in (a) such that a ratio of the hydrogen active species generated in (a) to a total of the oxygen active species and the hydrogen active species generated in (a) is equal to the predetermined ratio.

7. The method of claim 5, wherein the ratio of the flow rate of the hydrogen-containing gas to the total flow rate of the process gas is greater than 5%.

8. The method of claim 6, wherein the ratio of the flow rate of the hydrogen-containing gas to the total flow rate of the process gas is greater than 5% and equal to or less than 20%.

9. The method of claim 6, further comprises (c) loading the substrate into a process chamber before (a), wherein the oxygen active species and the hydrogen active species are generated in (a) by plasma-exciting the process gas supplied into the process chamber.

10. The method of claim 9, wherein each of a supply system of the oxygen-containing gas and a supply system of the hydrogen-containing gas are controlled in order to adjust the ratio of the flow rate of the hydrogen-containing gas to the total flow rate of the process gas and a ratio of a flow rate of the oxygen-containing gas to the total flow rate of the process gas.

11. The method of claim 3, wherein the film formed on the inner surface of the concave structure comprises an exposed layer whose oxygen concentration is reduced by an etching process, and the oxygen concentration of the exposed layer is lowest at the bottom of the concave structure.

12. The method of claim 1, wherein the film formed on the inner surface of the concave structure is constituted by an oxide film and a base film of the oxide film, and a thickness of the oxide film decreases toward the bottom of the concave structure.

13. A method of manufacturing a semiconductor device comprising:

(a) generating an oxygen active species and a hydrogen active species by exciting a process gas containing an oxygen-containing gas and a hydrogen-containing gas; and (b) forming an oxide layer by supplying the oxygen active species and the hydrogen active species to a substrate with a concave structure formed thereon to subject a film formed on an inner surface of the concave structure to oxidation from a surface of the film, wherein a ratio of a flow rate of the hydrogen active species to a total flow rate of the oxygen active species and the hydrogen active species supplied to the substrate in (b) is set to a ratio at which a rate of forming the oxide layer has a desired distribution in a depth direction of the concave structure.

14. A method of manufacturing a semiconductor device comprising:

(a) generating an oxygen active species and a hydrogen active species by exciting a process gas containing an oxygen-containing gas and a hydrogen-containing gas; and (b) forming an oxide layer by supplying the oxygen active species and the hydrogen active species to a substrate with a concave structure formed thereon to subject a film formed on an inner surface of the concave structure to oxidation from a surface of the film, wherein the oxide layer is formed in (b) such that a thickness of the oxide layer increases toward a bottom of the concave structure by adjusting a flow velocity of the oxygen active species and the hydrogen active species flowing on a surface of the substrate.

15. The method of claim 14, wherein the oxide layer is formed in (b) such that the thickness of the oxide layer increases toward the bottom of the concave structure by setting the flow velocity of the oxygen active species and the hydrogen active species flowing on the surface of the substrate to a predetermined flow velocity greater than a flow velocity at which a thickness distribution of the oxide layer in a depth direction of the concave structure is uniform.

* * * * *